United States Patent
Lee et al.

(10) Patent No.: US 9,530,831 B2
(45) Date of Patent: Dec. 27, 2016

(54) FLEXIBLE DISPLAY DEVICE HAVING FLEXIBLE DISPLAY SUBSTRATE CURVED AROUND SUPPORT SUBSTRATE

(71) Applicant: LG Display Co., Ltd., Seoul (KR)

(72) Inventors: Chanwoo Lee, Paju-si (KR); JongHyun Park, Seoul (KR); TaeWoo Kim, Paju-si (KR); Jaekyung Choi, Goyang-si (KR); Sangcheon Youn, Seoul (KR); SungJoon Min, Seoul (KR); SeYeoul Kwon, Goyang-si (KR); KwonHyung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/939,926

(22) Filed: Nov. 12, 2015

(65) Prior Publication Data

US 2016/0093683 A1 Mar. 31, 2016

Related U.S. Application Data

(63) Continuation of application No. 14/096,851, filed on Dec. 4, 2013, now Pat. No. 9,214,640.

(30) Foreign Application Priority Data

Dec. 28, 2012 (KR) .......................... 10-2012-0155873

(51) Int. Cl.
| | | |
|---|---|---|
| *H01L 27/32* | (2006.01) | |
| *H01L 51/00* | (2006.01) | |
| *H01L 51/52* | (2006.01) | |

(52) U.S. Cl.
CPC ....... *H01L 27/3267* (2013.01); *H01L 27/3244* (2013.01); *H01L 27/3276* (2013.01);
(Continued)

(58) Field of Classification Search
CPC .................. H01L 51/0097; H01L 2251/5338; H01L 27/3267; H01L 27/3244; H01L 27/3276; H01L 51/5293; H01L 51/5253; H01L 51/5246
See application file for complete search history.

(56) References Cited

U.S. PATENT DOCUMENTS

| | | |
|---|---|---|
| 5,436,744 A | 7/1995 | Arledge et al. |
| 7,217,990 B2 | 5/2007 | Chung |
| (Continued) | | |

FOREIGN PATENT DOCUMENTS

| | | |
|---|---|---|
| KR | 10-2011-0067448 | 6/2011 |
| KR | 10-2011-0068169 | 6/2011 |

OTHER PUBLICATIONS

PCT International Search Report for PCT/KR2013/012104, Apr. 29, 2014, 3 Pages.

*Primary Examiner* — Michael Jung
(74) *Attorney, Agent, or Firm* — Fenwick & West LLP

(57) ABSTRACT

A flexible display device and a method of manufacturing the same are provided. The flexible display device comprises a first flexible substrate including a display area including an organic light emitting layer, and a peripheral circuit area, and a second flexible substrate coming in contact with the first flexible substrate and including a pattern for facilitating bending thereof, wherein the second flexible substrate has a certain shape according to the pattern, and the first flexible substrate has a shape corresponding to the certain shape. Various embodiments of the present invention provide a flexible display device capable of realizing a narrow bezel-type or bezel-free display device and simultaneously realizing improved types of design, facilitating bending of a bezel area so as to realize a narrow bezel-type or bezel-free display device, and minimizing damage to an area to be bent.

10 Claims, 39 Drawing Sheets

(52) U.S. Cl.
CPC ...... *H01L 51/0097* (2013.01); *H01L 51/5246* (2013.01); *H01L 51/5253* (2013.01); *H01L 51/5293* (2013.01); *H01L 2251/303* (2013.01); *H01L 2251/5338* (2013.01); *Y02E 10/549* (2013.01)

(56) References Cited

U.S. PATENT DOCUMENTS

| | | |
|---|---|---|
| 8,796,921 B2 | 8/2014 | Nam |
| 2008/0055831 A1 | 3/2008 | Satoh |
| 2009/0219225 A1 | 9/2009 | Cope |
| 2009/0231816 A1 | 9/2009 | Lin |
| 2010/0171683 A1 | 7/2010 | Huitema et al. |
| 2011/0007042 A1 | 1/2011 | Miyaguchi |
| 2011/0050657 A1 | 3/2011 | Yamada |
| 2012/0151760 A1* | 6/2012 | Steijner ............ B24B 1/00 29/831 |
| 2013/0002133 A1* | 1/2013 | Jin ............ G06F 1/169 313/511 |
| 2013/0002572 A1 | 1/2013 | Jin et al. |
| 2013/0076268 A1* | 3/2013 | Choi ............ H05B 33/10 315/312 |
| 2013/0148312 A1 | 6/2013 | Han et al. |
| 2013/0169515 A1 | 7/2013 | Prushinskiy et al. |
| 2013/0342429 A1* | 12/2013 | Choi ............ H05K 13/00 345/30 |
| 2013/0343012 A1 | 12/2013 | Park |
| 2014/0042406 A1 | 2/2014 | Degner et al. |
| 2014/0126228 A1* | 5/2014 | Lee ............ H05K 5/0017 362/382 |
| 2014/0152646 A1 | 6/2014 | Kang et al. |

\* cited by examiner

FLEXIBLE DISPLAY DEVICE HAVING FLEXIBLE DISPLAY SUBSTRATE CURVED AROUND SUPPORT SUBSTRATE

CROSS-REFERENCE TO RELATED APPLICATION

This application is a continuation application of a co-pending U.S. patent application Ser. No. 14/096,851 filed on Dec. 4, 2013, which claims priority to and the benefit of Republic of Korea Patent Application No. 10-2012-0155873 filed on Dec. 28, 2012, which are incorporated by reference herein in their entirety.

BACKGROUND

1. Field of the Invention

The present invention relates to a flexible display device, and more particularly to a narrow bezel or a bezel-free flexible display device and a method of manufacturing the same.

2. Discussion of Related Art

Display devices used in monitors of computers, TVs, and cell phones include organic light emitting display devices (OLEDs) and plasma display panels (PDPs), both of which autonomously emit light, and liquid crystal display devices (LCDs) requiring a separate light source, etc.

In recent years, flexible display devices manufactured using materials exhibiting inflexibility, such as flexible materials (i.e., plastics), to display an image even when bent like paper have received attention as next-generation display devices.

Flexible display devices have been widely used in the field of applications spanning from monitors of computers and TVs to personal portable equipment, and research on flexible display devices having a large display area and a smaller volume and weight has been conducted.

Various kinds of highly complicated technology, such as wire positioning, line width setting, and signal transfer, are required to realize a narrow bezel.

SUMMARY OF THE INVENTION

Embodiment relate to a flexible display device including a flexible display substrate and a support substrate. The flexible display substrate includes a display area and a peripheral circuit area. The display area is formed with pixel elements for generating an image. The peripheral circuit area includes components to transmitting signals to the pixel elements in the display area. A support substrate is attached to the flexible display substrate to provide rigidity to the flexible display device. The support substrate includes a non-bending area, and a bending area. The bending area extends along a boundary of the peripheral circuit area and the bending area, the bending area adjacent to the non-bending area, the bending area less rigid than the non-bending area.

In one embodiment, thin film transistors are formed as the pixel elements on the flexible display substrate. The thin film transistors operate light emitting elements formed on the flexible display substrate based on the transmitted signals.

In one embodiment, the bending area is formed with a plurality of holes, a slit extending across the bending area or a half-cut channel.

In one embodiment, the half-cut channel is a hollow channel with an opening facing towards the flexible display substrate or facing away from the flexible display substrate.

In one embodiment, the flexible display device further includes a cover glass having a display region corresponding to the display area of the flexible display substrate.

In one embodiment, the flexible display substrate is bent at a substantially right angle along the bending area.

In one embodiment, the flexible display device further includes a polarizer on the flexible display substrate. The polarizer is formed with a pattern along the bending area to provide flexibility to the polarizer in the bending area.

In one embodiment, the flexible display device further includes a metal substrate interposed between the flexible display substrate and the support substrate.

In one embodiment, the flexible display device further includes an encapsulation layer extending over at least a portion of the display area and at least a portion of the peripheral circuit area.

In one embodiment, the flexible display device further includes a layer on the components for transmitting the signals in the peripheral circuit area to reduce tensile stress in the components when bending occurs in the bending area.

Embodiments also relate to a flexible display device that includes a flexible display substrate and a support substrate disposed on the flexible display substrate. The flexible display substrate has a display area and a peripheral circuit area. The display area is juxtaposed to a peripheral circuit area. A support substrate is disposed on the flexible display substrate. The support substrate has a bending pattern to provide flexibility at a bending area of the support substrate and to reduce resilient force of the flexible display device. The bending area corresponds to a boundary between the display area and the peripheral circuit area of the flexible display substrate.

In one embodiment, the bending pattern is a plurality of holes spaced apart from each other by a predetermined distance.

In one embodiment, a bending angle between the display area and the peripheral circuit area is between 70 degrees and 110 degrees.

Embodiments also relate to a multi-layered substrate structure including a first flexible substrate, and a second flexible substrate. The second flexible substrate is fixed to the first flexible substrate and is more rigid than the first flexible substrate. The second flexible substrate is formed with a bending pattern to define a bending area along which the multi-layered substrate structure is bent. An organic light emitting element is also placed on the first flexible substrate of the multi-layered substrate structure.

In one embodiment, the bending pattern is formed along a boundary between a display area and a peripheral circuit area of the second flexible substrate.

In one embodiment, the multi-layered substrate structure is formed with at least another bending pattern at an end portion of the second flexible substrate.

In one embodiment, the multi-layered substrate structure includes at least two separated display areas of the first flexible substrate. The bending pattern is formed in a boundary of the at least two separated display areas.

In one embodiment, at least one display area is placed between the bending pattern and the other bending pattern.

In one embodiment, the bending pattern includes a plurality of holes aligned along the boundary between a display area and a peripheral circuit area of the multi-layered substrate structure.

In one embodiment, the bending pattern includes a half-cut channel on one surface of the second flexible substrate facing the first flexible display substrate or facing away from the first flexible display substrate.

In one embodiment, the multi-layered substrate structure is bent at a substantially right angle along the bending area and the organic light emitting element remains substantially planar.

Embodiments also relate to a flexible display device including a flexible display substrate and a plurality of support substrate. The flexible display substrate includes a plurality of display areas. Each of the display areas formed with pixel elements for generating an image. The support substrates are more rigid than the flexible display substrate, each of the support substrate fixed to a selected portion of the flexible display substrate to maintain the selected portion of the flexible substrate in a planar shape. The flexible display substrate is bent at a bending area not fixed with the at least one support substrates.

In one embodiment, the selected portion corresponds to one of the display areas of the flexible display substrate and the bending area includes a non-display area for transmitting signals to the one of the display areas.

In one embodiment, the flexible display substrate includes a first portion fixed with a first support substrate, a second portion fixed with a second support substrate, and a third portion fixed with a third support substrate. A first bending portion is formed between the first portion and the second portion, and a second bending portion is formed between the second portion and the third portion.

In one embodiment, each of at least two adjacent support substrates has a side end, which is not perpendicular to the corresponding portion of the flexible display substrate. Instead, the side end of at least two adjacent support substrates is angled so that the gap between the two adjacent support substrates is reduced upon bending of the flexible substrate.

It is to be understood that both the foregoing general description and the following detailed description are and explanatory and are intended to provide further explanation of the invention as claimed.

BRIEF DESCRIPTION OF THE DRAWINGS

The accompanying drawings, which constitute a part of this specification, illustrate various embodiments of the present invention.

DETAILED DESCRIPTION OF EMBODIMENTS

Figure 1A:
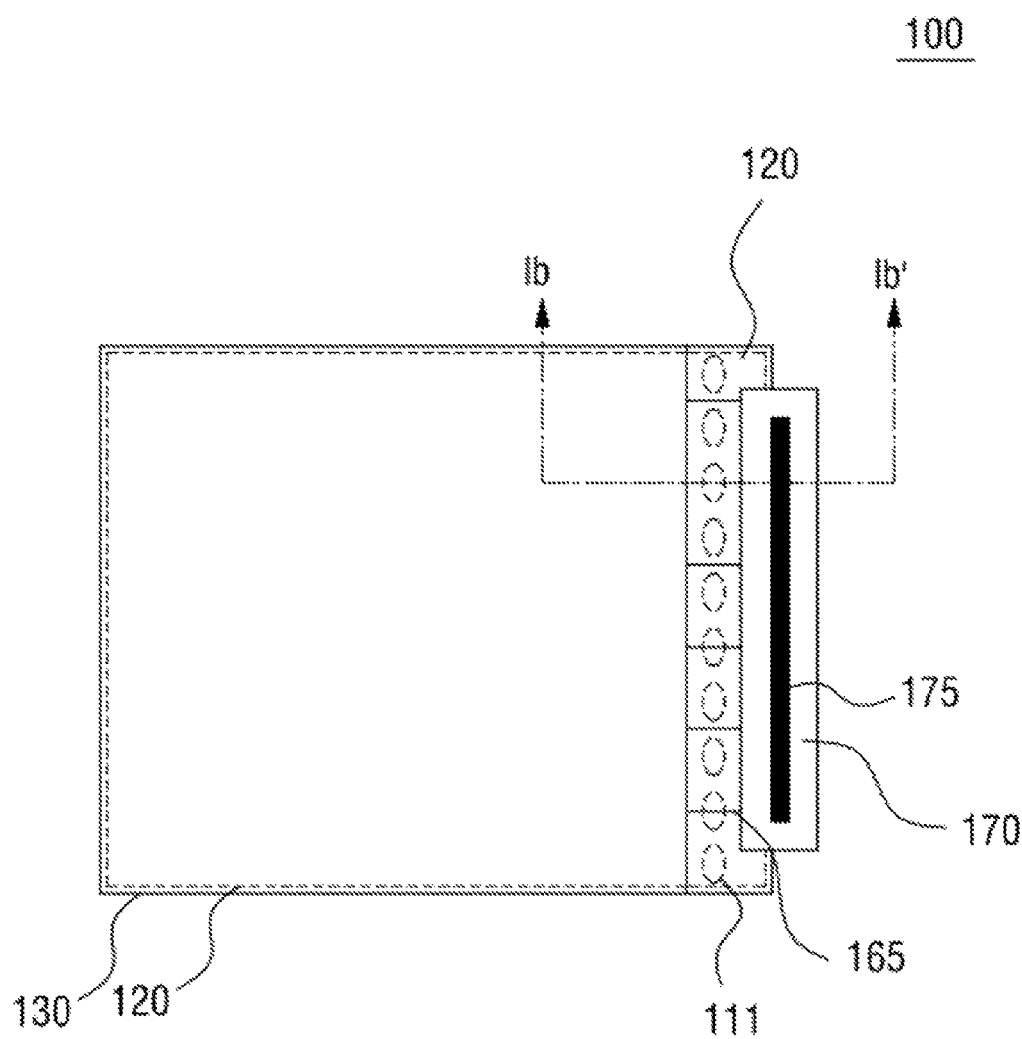
FIG. 1A is a top view of a flexible display device according to an embodiment of the present invention.

Embodiments of the present invention will be described in detail below with reference to the accompanying drawings. It is noted that the drawings of the present application are provided for illustrative purposes only and, as such, the drawings are not drawn to scale. In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" another element, it can be directly on the other element or intervening elements may also be present. In contrast, when an element is referred to as being "directly on" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Further, it will be understood that when an element is referred to as being "overlapped" with another element, one element can be positioned above the other element or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of embodiments.

An organic light emitting display device described herein includes one or more OLED elements. The OLED elements can be configured to operate in one of a top, bottom or dual emission mode, depending on the direction light exiting the OLED elements. An OLED element is classified as bottom emission mode OLED element if the light emitted from the OLED element passes through a transparent or a semi-transparent bottom electrode and substrate on which the panel was manufactured. An OLED element is classified as a top emission mode OLED element if the light emitted from the OLED element exits through a transparent or a semi-transparent top electrode. An OLED element can be classified as a dual emission mode OLED element if the light emitted from the OLED element exits through both the top and bottom electrodes to emit light on both sides of the OLED element. The components of the organic light emitting display device including, but not limited to, a thin film transistor, an anode, and a cathode as well as the structure of organic EL layer design, may be configured differently based on the aforementioned emission modes without departing from the sprit of the present invention.

A flexible display device herein refers to a display device having some degree of flexibility. The flexible display device herein is synonymous with a bendable display device, a rollable display device, an unbreakable display device, or a foldable display device. As described herein, a flexible organic light emitting display device is one example of various flexible display devices.

The flexible display device described in the present disclosure may be transparent. In the present disclosure, the terms "transparent" and "translucent" are used interchangeably to indicate property that light at least partially passes through the flexible display device such that objects behind the display device is visible. Accordingly, a transparent display device refers to a display device in which at least a part of the screen is transparent or semi-transparent so that the viewer is able to see the content displayed by the device while still being able to see the objects behind the display device in some degree.

The term "peripheral circuit area" described herein refers to an area where various circuits and wires are provide to transmit signals to the OLED. To increase the transparency of the flexible display device, non-transparent or opaque components of the display device (e.g., battery, printed circuit board, metal frame), can be disposed in the peripheral circuit area rather than in the display/non-display display areas.

The term "display area" is described herein refers to an area of the flexible display device where image is actually displayed. In case of transparent flexible display device, the display area may include both a pixel area and a non-pixel area. In such embodiment, the pixel area is configured to emit light for displaying image, while the non-pixel area is formed to be transparent so that external light can pass through the display device.

Hereinafter, various embodiments of the present invention will be described in further detail with reference to the accompanying drawings.

Figure 1B:
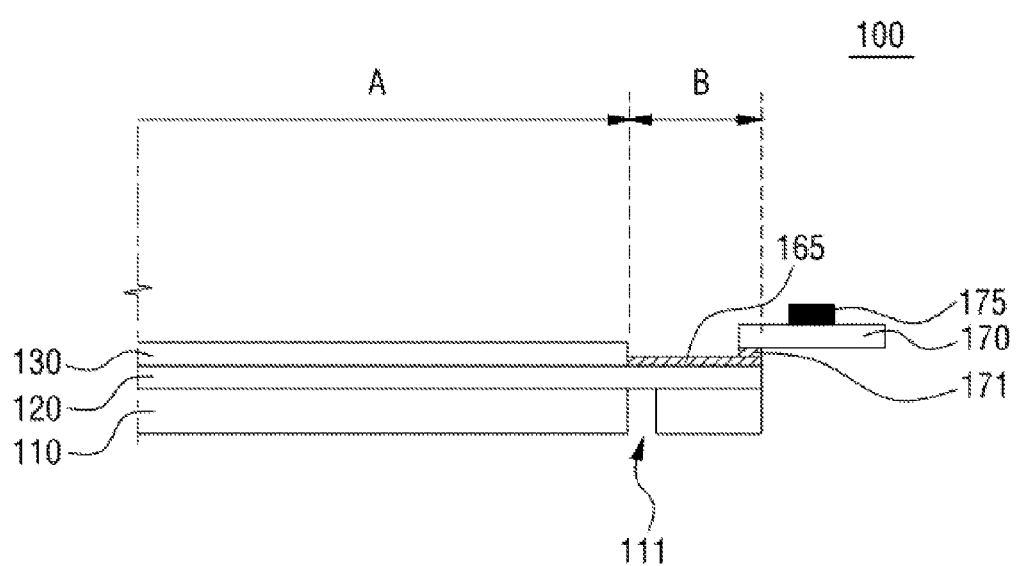
FIG. 1B is a cross-sectional view of the flexible display device taken along the line Ib-Ib' of FIG. 1A.

FIG. 1A is a top view of an flexible display device according to an embodiment of the present invention. FIG. 1B illustrates a cross-sectional view of the flexible display device, which is taken along the line Ib-Ib' of FIG. 1A. Referring to FIGS. 1A and 1B, the flexible display device 100 includes a multi-layered substrate structure formed of a support film 110 and a flexible substrate 120, a display unit 130, a wire 165, and a drive circuit unit 170.

The flexible substrate 120 is a substrate configured to support various elements of the flexible display device 100. The flexible substrate 120 may also be referred to as a flexible substrate, a first flexible substrate, or a flexible member. When the flexible substrate 120 is formed of a plastic, the flexible substrate 120 may be referred to as a plastic film, or a plastic substrate.

FIGS. 1A and 1B show that the flexible substrate 120 is in the form of a parallelopipedon. However, it should be noted that the flexible substrate 120 can be formed in various other shapes.

The flexible substrate 120 is made of a flexible material. The flexible substrate 120 may be made of material such as a polyester-based polymer, a silicone-based polymer, an acrylic polymer, a polyolefin-based polymer, and a copolymer thereof. More particularly, the flexible substrate 120 may be made of material such as polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, a cyclic olefin copolymer (COC), a cyclic olefin polymer (COP), polyethylene (PE), polypropylene (PP), polyimide (PI), polymethylmetacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and a combination thereof. The flexible substrate 120 can also be formed of a transparent flexible material.

The flexible substrate 120 includes a display area "A" and a peripheral circuit area "B". The display area A of the flexible substrate 120 refers to an area for displaying image, and the peripheral circuit area B refers to an area where no image is displayed. The peripheral circuit area B of the flexible substrate 120 may be positioned at one side of the display area A of the flexible substrate 120. Since the peripheral circuit area B only contains wires and circuits and does not display any images therefrom, a protective member (e.g., housing, bezel) often covers the peripheral circuit area B. The peripheral circuit area B of the flexible substrate 120 may be formed in a polygonal shape, and the peripheral circuit area B of the flexible substrate 120 may include an area extending from one side of the display area A of the flexible substrate 120. Since the peripheral circuit area B of the flexible substrate 120 is positioned at a peripheral or edge portion of the display area A of the flexible substrate 120, the peripheral circuit area B of the flexible substrate 120 may be referred to as a peripheral area, an edge area, or a bezel area.

Such protective member is usually formed with a material having substantially more rigidity than the flexible display device 100 and limits the design of the flexible display device 100. Further, the protective member makes the display device to stand out from the surroundings, thereby making impedes immersive viewing experience to the viewers. Accordingly, it is advantageous to bend or curve the peripheral circuit area B so that the bezel area for covering the peripheral circuit area B can be reduced (i.e., narrow-bezel) or eliminated (i.e., bezel-free). However, the support film 110 has much greater rigidity than the flexible substrate 120. When the display area A is bent, stress may be formed at or near the bend area of the display unit 130, causing the display unit 130 or other components on the display unit 130 to peel off from the flexible substrate 120.

A display unit 130 may extend partially or entirely over the display area A of the flexible substrate 120. The display unit 130 is a component that actually displays an image, and may be referred to as an image display unit or display panel. In some embodiments, display unit 130 is embodied as an OLED that generates images by emitting light from one or more organic light emitting layers.

Some or all of the elements of the display device that do not emit light can be disposed at the peripheral circuit area B of the flexible substrate 120. The elements disposed at the peripheral circuit area B of the flexible substrate 120 may be connected to a drive circuit unit 170 equipped within various ICs 175 (e.g., gate driver ICs or source driver ICs), a wire 171, and a wire 165 electrically connecting the drive circuit unit 170 to the display unit 130. The wire 165 electrically connects the display unit 130 disposed at the display area A to other elements disposed at the peripheral circuit area B of the flexible substrate 120. Therefore, part of the wire 165 may be disposed within the display area A of the flexible substrate 120. The drive circuit unit 170 may be installed in the flexible substrate 120 using various techniques such as tape-carrier-package (TCP), chip-on-film (COF), and gate-in-panel (GIP) methods.

The support film 110 may come in contact with the flexible substrate 120 and support the flexible substrate 120. The support film 110 may also be referred to as a back film, a rear film, a second flexible substrate, or a protective film. In embodiments where the flexible substrate 120 is formed of a flexible plastic thin film, but flexible substrate 120 is vulnerable to external moisture and air. As a result, the display unit 130 formed on the flexible substrate 120 may become damaged. Therefore, in the flexible display device 100 according to one embodiment of the present invention, the support film 110 may be disposed at a rear surface of the flexible substrate 120 to reduce penetration of moisture and air to the display unit 130. The support film 110 may be formed of substantially the same material as the flexible substrate 120, but may be thicker than the flexible substrate 120.

The support film 110 includes a non-bending area and a bending area formed with a bending pattern 111 to reduce rigidity of the support film 110 in the corresponding areas. That is, the bending area of the support film 110 formed with the bending pattern 111 is more flexible than other non-bending areas of the support film 110, and hence, the bending can be localized to bending area formed with the bending pattern 111. Because the support film 110 can be bent along the bending area formed with the bending pattern 111, the flexible substrate 120 and the support substrate 110 can remain fixed even after the bending of the flexible display device 100.

In the example of FIGS. 1A and 1B, the bending pattern 111 is formed along the boundary between the display area A and the peripheral circuit area B to afford flexibility to the support substrate 110 in the bending area along the boundary. As shown in FIG. 1A, the bending pattern 111 includes a plurality of through-holes in the support film 110. Although the through-holes are shown as having an oval section, the openings can be formed in various other shapes (e.g., a square and triangle) and in various sizes.

The bending area formed with the bending pattern 111 may be centered at the boundary between the display area A and the peripheral circuit area B of the flexible substrate 120. In some embodiments, center of the bending area may be slightly offset towards the peripheral circuit area B so that the bending of the flexible substrate 120 and the support film 110 does not affect the display unit 130. The bending pattern 111 may also be in the form of a plurality of rows, at or near the boundary between the display area A and the peripheral circuit area B of the flexible substrate 120.

FIGS. 1C to 1F are cross-sectional views of flexible display devices according to various embodiments of the present invention. In FIGS. 1C to 1F, the embodiments as shown in FIGS. 1C to 1F are distinguished by adding letters to the ends of reference numerals used in FIGS. 1A and 1B. However, the elements shown in FIGS. 1C to 1F are substantially identical to the elements shown in FIGS. 1A and 1B, which have the same numerals except for the letters in the corresponding reference numerals.

Figure 1C:
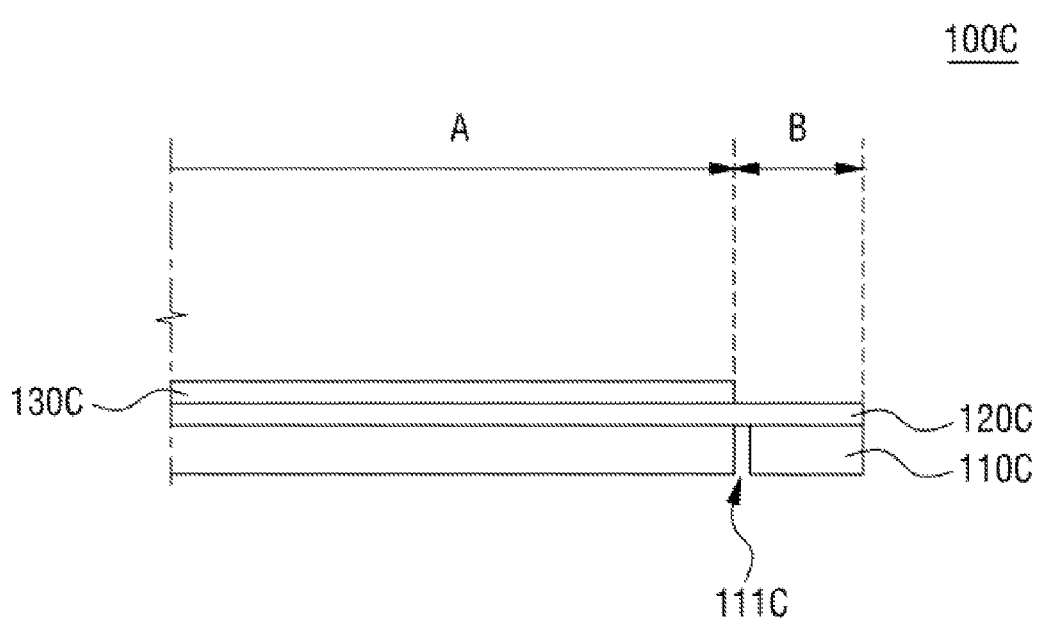
FIGS. 1C to 1I are cross-sectional views of flexible display devices according to various embodiments of the present invention.

Referring to FIG. 1C, first, a bending pattern 111C may include a via hole formed through top and bottom surfaces of a support film 110C. The via hole may be formed in various shapes such as a cylindrical shape, a polyprismatic shape, etc., and a size of the via hole may be determined according to various designs.

The bending pattern 111C may be formed in a bending area using various stitching processes in which holes such as a via hole may be formed in the support film 110C. As the various stitching processes for forming the bending pattern 111C, laser processes and mechanical processes such as a piercing process, a punching process and a press process may be used.

Figure 1D:
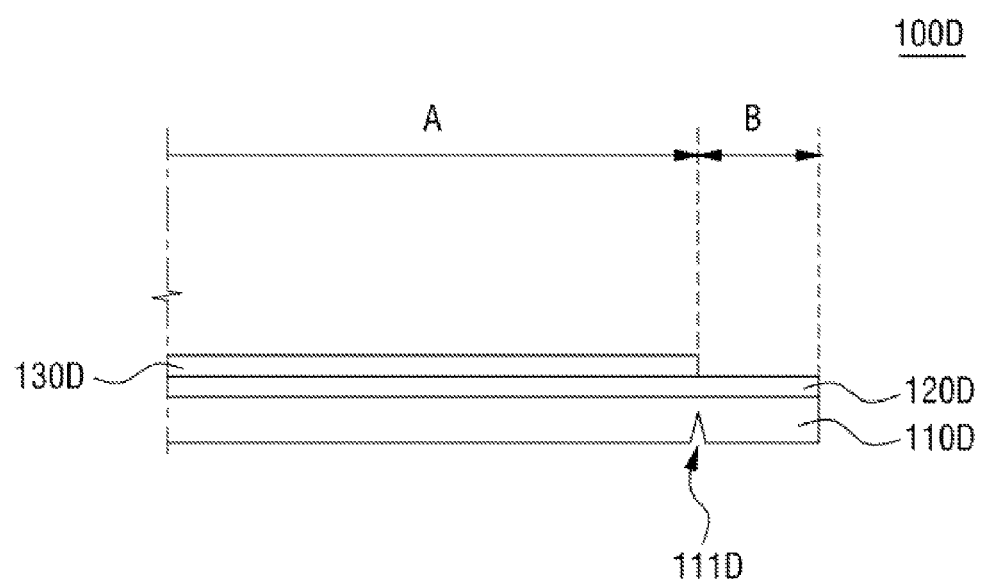

Referring to FIG. 1D, a bending pattern 111D can be formed as a half-cut channel in a bending area having an opening that faces away from the flexible display substrate 120D. In other words, the bending pattern 111D is a hollow space formed along the boundary of the display area A and the peripheral circuit area B, in which the hollow space has limited depth that does not penetrate through the support film 111D. Although the half-cut channel has a cross-sectional shape of a wedge in FIG. 1D, the half-cut channel can have other cross-sectional shapes such as a cone shape, a polypyramid shape, a cylinder, a polyprismatic shape, and the likes. Further, the opening size of the half-cut channel as well as the depth of the half-cut channel through the support film 110D can vary according to the degree of flexibility desired at the bending pattern.

The flexibility of the support film 110D is increased as the support film 110D is partially carved out along the boundary between the display area A and the peripheral circuit area B. Also, the support film 110D remaining in the bending area (after forming the bending pattern 111D) functions as a hinge for bending the flexible display device 100D. Accordingly, when the half-cut channel has its opening on the bottom surface of the support film 110D, the support film 110D and the flexible substrate 120D can be bent or curved more easily towards the bottom surface of the support film 110D having the hollow channel formed therein.

Figure 1E:
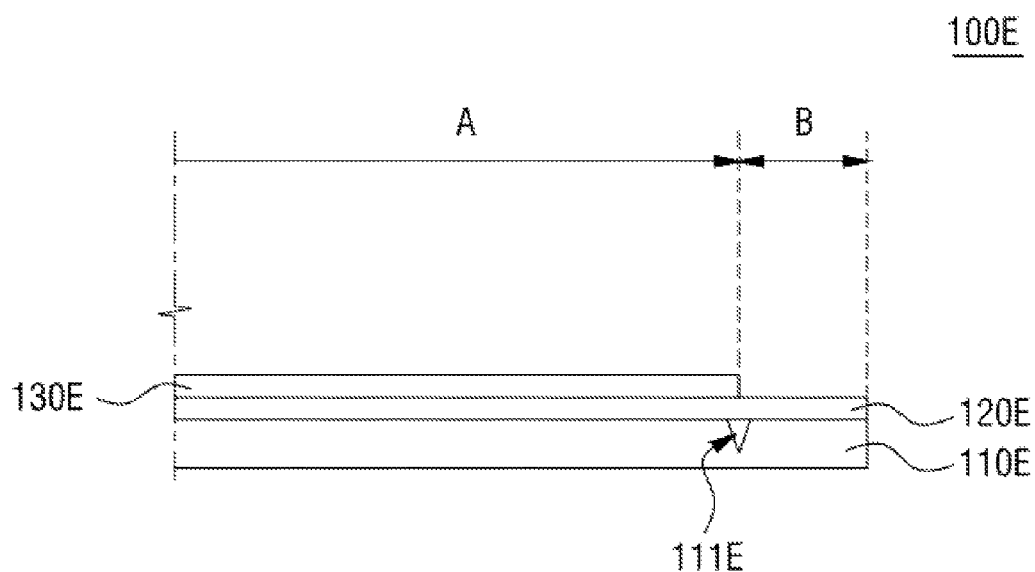

As shown in FIG. 1E, in some other embodiments, the half-cut channel 111E can be formed in the support film 110E in such a way that its opening faces the flexible display substrate 120E. In such configurations, the support film 110E and the flexible substrate 120E may be bent inward toward a bottom surface of the support film 110E in which a groove is not formed.

Figure 1F:
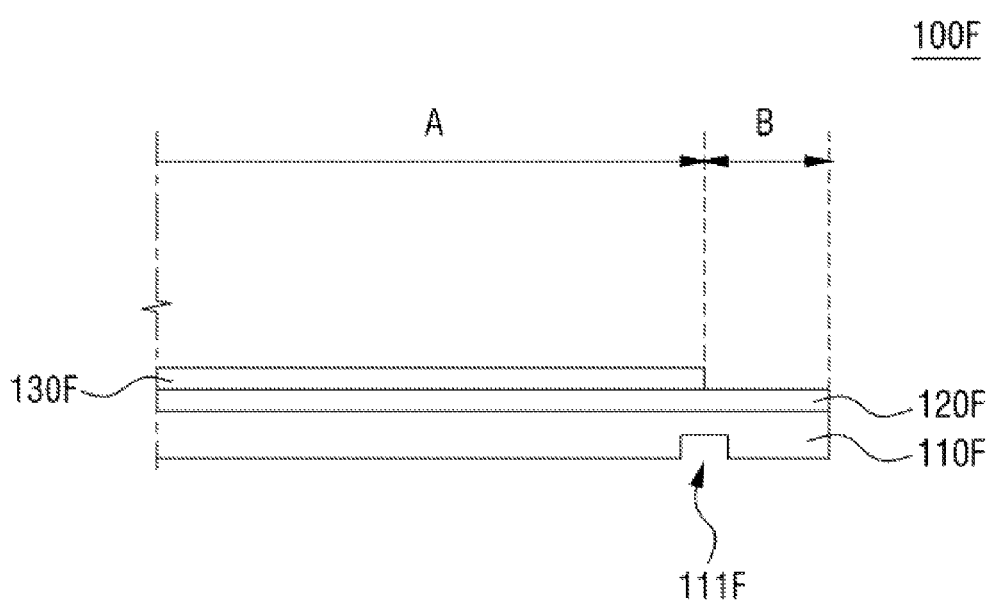

FIG. 1F illustrates yet another type of bending pattern 111F, which can be employed in various embodiments of the present invention. As shown, the support film 110F can be carved out to form a recessed region (i.e., bending pattern 111F) in a bending area along the boundary of the display area A and the peripheral circuit area B. In FIG. 1F, the support film 110F is cutout, or otherwise carved out, in a rectangular shaped cross-section to create a rectangular channel shaped recess along the boundary of the display area A and the peripheral circuit area B. It should be understood that the support film 110F can be cutout in various other shapes to form channels having different shapes. For instance, the cutout in the support film 110F can be in a rounded shape so that the recession along the boundary has a semi-circular channel shape. Similar to the half-cut channel described above, the recessed region (e.g., bending pattern 111F) may be formed on a top and/or bottom surface of the support film 110F to facilitate bending of the flexible display device in the both directions. Depending on the degree of flexibility required by the flexible display device 100F, the dimension of cutout (i.e., the volume of the support film 110F removed therefrom) along the boundary as well as the shape of the cutout can vary.

The bending patterns 111D, 111E and 111F may be formed in the bending area using a variety of methods capable of cutting out, or otherwise carving out, the support substrate. For instance, the support substrate can be carved out in a desired shape and size (e.g., depth, width, length) by using laser and/or mechanical tools. Such tools can be employed to conduct various processes, including but not limited to, a piercing process, a punching process and a press process to half-cut the support film according to the desired specification.

In the embodiments described herein, the bending patterns are illustrated as being formed in a bending area of the support film along the boundary between the display area A and the peripheral circuit area B. However, it should be noted that the bending pattern can be formed at a boundary between two adjacent but distinct display areas of the flexible display device. For example, a flexible display device may include two immediately adjacent display areas disposed next to a peripheral circuit area, and the bending patterns can be formed along the boundary between the two immediately adjacent display areas as well as the boundary between the juxtaposed adjacent display areas and the peripheral circuit area.

Further, each of the bending pattern types 111C, 111D, 111E and 111F are described herein as being formed in a discrete flexible display device. Some embodiments of the flexible display device may employ multiple types of the bending patterns described herein. For instance, a flexible display device may include a plurality of bending patterns formed on the support substrate, and one bending patterns can be formed with a plurality of holes and while another bending patterns is formed as a half-cut channel and/or recessed region described above. In some embodiments, one layer of the flexible display device (e.g., flexible display substrate 120) might be configured with one type of bending pattern, while another layer of the flexible display device (e.g., polarizer) is configured with different type(s) of bending pattern.

Figure 1G:
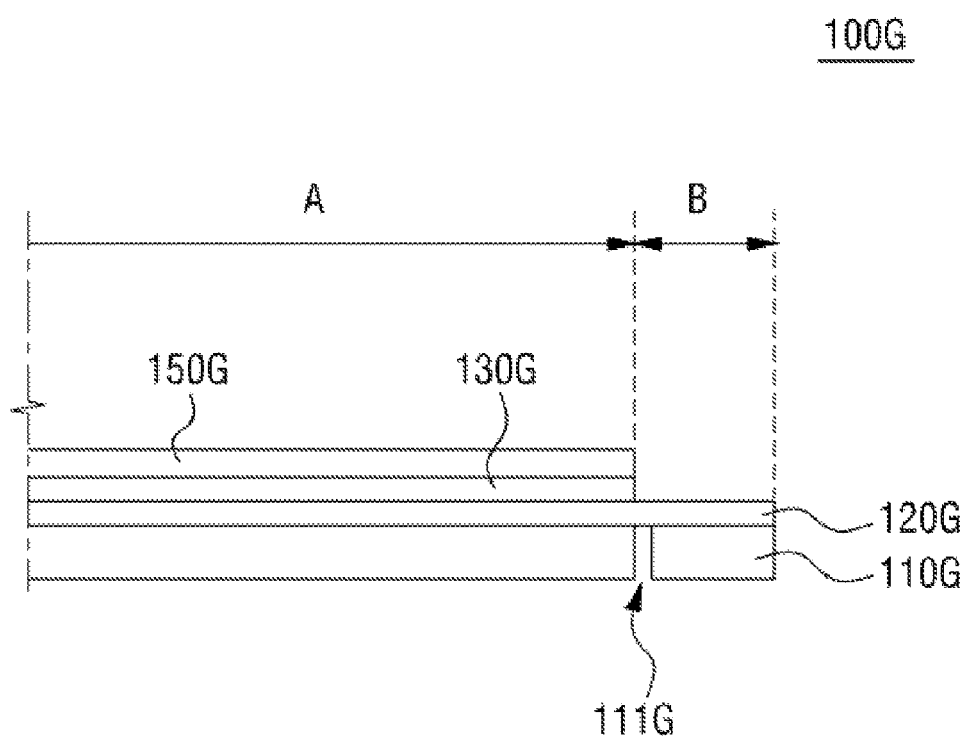

FIG. 1G is a cross-sectional view of a flexible display device according to another embodiment. The elements shown in FIGS. 1C and 1G are substantially identical to each other when the elements have the same numerals other than the alphabet characters in the corresponding reference numerals, and thus repeated description of the elements is omitted herein for the sake of brevity. Referring to FIG. 1G, a polarizer 150G coming in contact with a flexible substrate 120G and covering a display area A of the flexible substrate 120G is disposed. The polarizer 150G may be referred to as a polarizer film. In the case where display unit 130G is an organic light emitting diode, a contrast ratio (CR) is markedly degraded when an external light incident from the outside is reflected on a metal electrode or a wire of the organic light emitting diode. In the flexible display device 100G according to another embodiment of the present invention, degradation of the contrast ratio caused by reflection of external light may be prevented by disposing the polarizer 150G on the flexible substrate 120G of the flexible substrate 120G, that is, the display unit 130G. Also, the polarizer 150G may be formed only on the display area A of the flexible substrate 120G to reduce peeling of the polarizer 150G when a peripheral circuit area B of the flexible substrate 120G is bent.

Figure 1H:
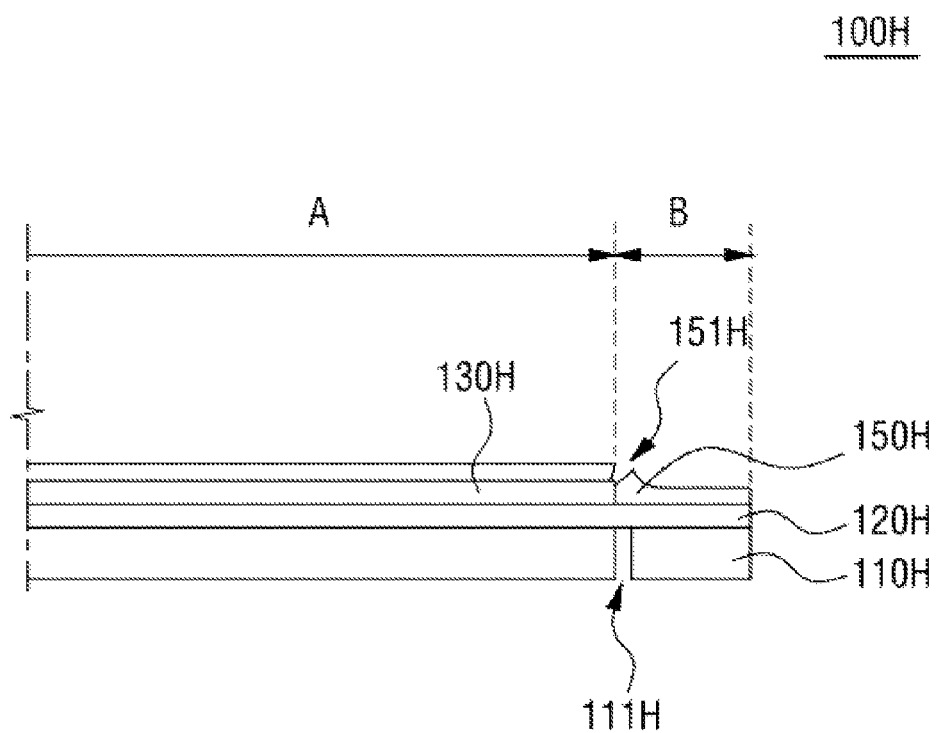

FIG. 1H is a cross-sectional view of a flexible display device according to still another embodiment of the present invention. The elements shown in FIGS. 1G and 1H are substantially identical to each other when the elements have the same numerals other than the alphabet characters in the corresponding reference numerals, and thus repeated description of the elements is omitted herein for the sake of brevity. A polarizer 150H coming in contact with a flexible substrate 120H and covering a display area A of the flexible substrate 120H and at least a part of a peripheral circuit area B of the flexible substrate 120H is disposed. The polarizer 150H includes a pattern 151H for facilitating bending thereof, and the pattern 151H may be formed in a bending area of the polarizer 150H along the boundary between the display area A and the peripheral circuit area B of the flexible substrate 120H to facilitate bending of the polarizer 150H, the flexible substrate 120H and the support film 110H, particularly, to facilitate bending of the polarizer 150H, the flexible substrate 120H and the support film 110H with respect to the boundary between the display area A and the peripheral circuit area B.

The bending pattern 111H for facilitating the bending of the support film 110H is formed in the bending area where the pattern 151H are also formed to facilitate the bending of the polarizer 150H. That is, both the pattern 151H and the bending pattern 111H may be formed in the bending area along the boundary between the display area A and the peripheral circuit area B of the flexible substrate 120H. The pattern 151H and the bending pattern 111H may be formed in the same or different shapes. The pattern 151H and the bending pattern 111H may facilitate the bending of the polarizer 150H, the flexible substrate 120H and the support film 110H, particularly, facilitate the bending of the polarizer 150H, the flexible substrate 120H and the support film 110H with respect to the boundary between the display area A and the peripheral circuit area B.

As briefly mentioned above, the flexible display device 100H may include two display areas that are immediately adjacent to each other, and the bending patterns 111H and 151H can be formed at or near the boundary between the two immediately adjacent display areas. Moreover, the bending pattern 111H formed on the support film 110H may differ from the bending pattern 151H formed on the polarizer 150H.

Figure 1I:
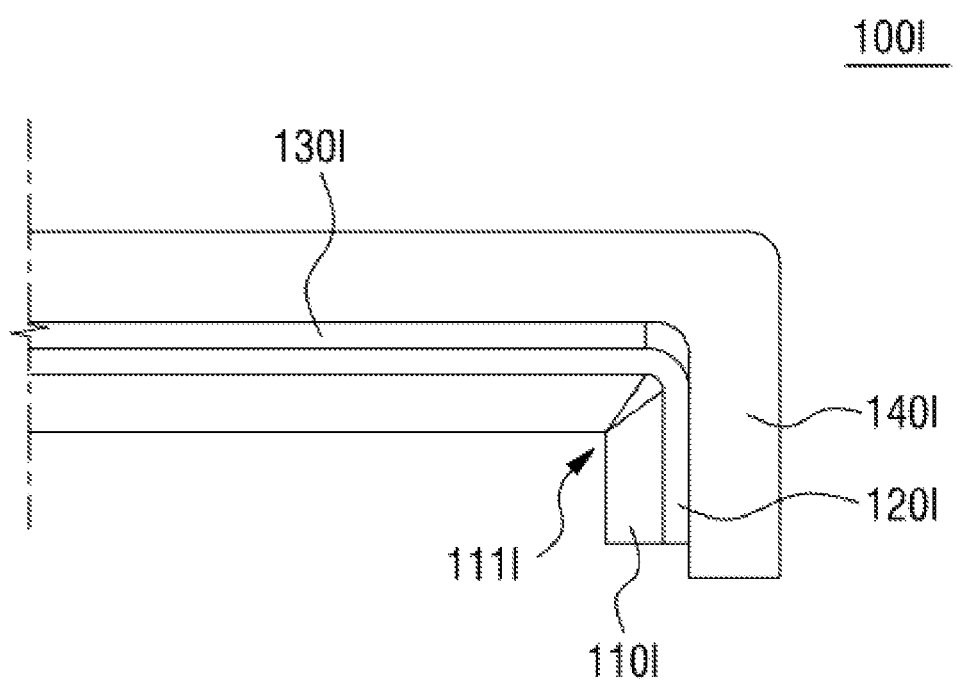

FIG. 1I is a cross-sectional view of a flexible display device 100I according to yet another embodiment. The elements shown in FIGS. 1C and 1I are substantially identical to each other when the elements have the same numerals other than the alphabet characters in the corresponding reference numerals, and thus repeated description of the elements is omitted herein for the sake of brevity. Referring to FIG. 1I, a cover 140I serves to protect a flexible display device 100I from external moisture, air and impact. Therefore, the cover 140I may be referred to as a lid or a cover member. The cover 140I may be formed of a transparent material since the cover 140I is disposed on a top surface of a flexible substrate 120I including a display unit 130I. The cover 140I may be formed of a material having a high strength, such as glass, so as to improve a mechanical strength. When the cover 140I is formed of glass, the cover 140I may be an injection-molded glass.

The cover 140I may have a first surface in contact with the flexible substrate 120I including the display unit 130I and corresponding to a top surface of a first area of the flexible substrate 120I, and a second surface extending from the first surface. The first surface of the cover 140I may extend along a plane parallel to the top surface of the display area A of the flexible substrate 120I, and the second surface of the cover 140I may extend along a plane that is not parallel to the top surface of the display area A of the flexible substrate 120I but parallel to the surface of the flexible substrate 120I in the peripheral circuit area B. The first and second surfaces of the cover 140I may adjoin at various angles such as an acute angle, a right angle and an obtuse angle. Preferably, the first and second surfaces of the cover 140I adjoin at an angle in the range of 70 degrees to 110 degrees.

When the first and second surfaces of the cover 140I adjoin at an acute angle, a right angle or an obtuse angle, at least one section of the cover 140I may have a curved shape. For example, when the first and second surfaces of the cover 140I form a right angle as shown in FIG. 1I, a section of the cover 140I may have a shape curved at a right angle, and have a "⌐"-shaped section. For ease of explanation, FIG. 1I shows that the cover 140I has a shape curved at a right angle, but the present invention is not limited thereto. For example, the cover 140I may have a shape curved at an acute angle or an obtuse angle, and may be formed in a curved shape having a non-linear section.

The flexible substrate 120I may be bent according to the shape of the cover 140I. The flexible substrate 120I, the display unit 130I and the support film 110I may be coupled with the cover 140I as shown in FIG. 1I. While coupling the flexible substrate 120I, the display unit 130I and the support film 110I with the cover 140I, the second area of the flexible substrate 120I and an area of the support film 110I corresponding to the second area of the flexible substrate 120I may be guided and curved by the cover 140I, and the second area of the flexible substrate 120I and an area of the support film 110I corresponding to the second area of the flexible substrate 120I may be positioned on planes different from planes in which the first area of the flexible substrate 120I and an area of the support film 110I corresponding to the second area of the flexible substrate 120I are placed, as shown in FIG. 1I.

The cover 140I and the flexible substrate 120I including the display unit 130I may be attached to each other by means of a pressure-sensitive adhesive member. When the pressure-sensitive adhesive member such as a photocurable material or an optically clear adhesive (OCA) is disposed on the cover 140I or the flexible substrate 120I including the display unit 130I, and the cover 140I is coupled with the flexible substrate 120I, the display unit 130I and the support film 110I, the cover 140I may be coupled with the flexible substrate 120I, the display unit 130I and the support film 110I by means of the pressure-sensitive adhesive member.

The cover 140I may include a touch screen panel. The cover 140I may be formed on the first area of the flexible substrate 120I on which the display unit 130I is disposed. Therefore, an image generated on the display unit 130I may be viewed through the cover 140I, and the cover 140I may include a touch screen panel to accommodate an input by touch of a user.

Figure 2A:
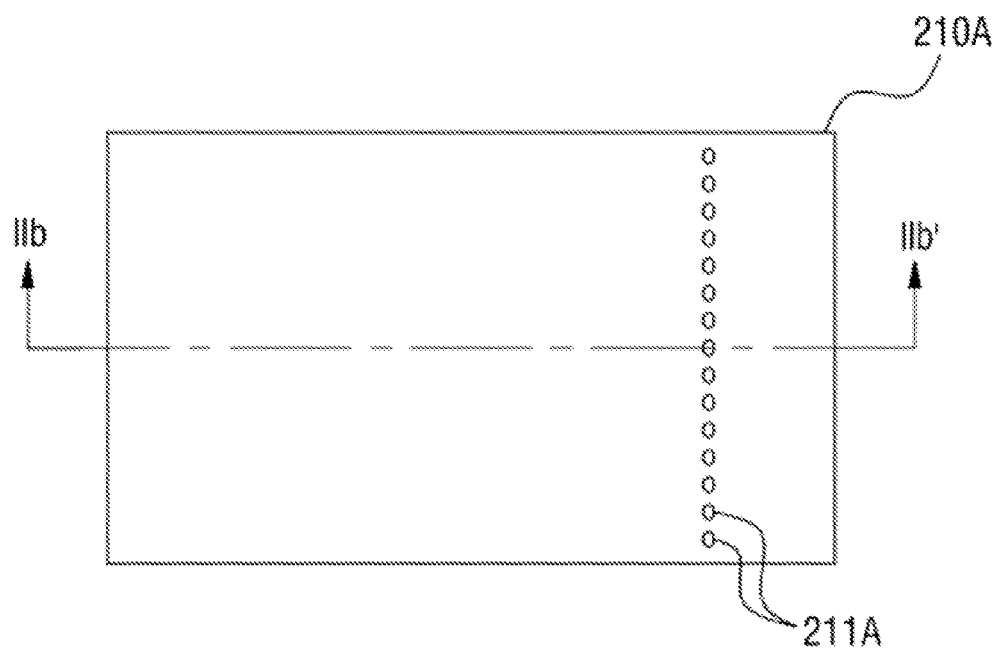
FIG. 2A is a top view of a support film used to illustrate the flexible display device according to an embodiment of the present invention.
Figure 2B:
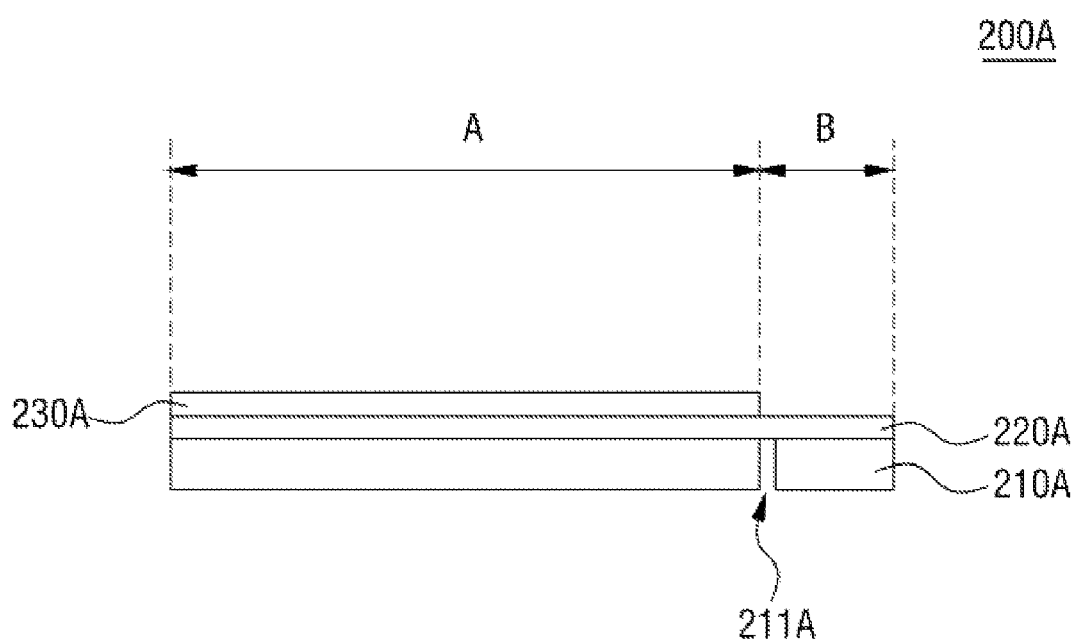
FIG. 2B is a cross-sectional view of the flexible display device taken along the line IIb-IIb' of FIG. 2A.

FIG. 2A is a top view of a support film used to illustrate the flexible display device according to an embodiment. FIG. 2B is a cross-sectional view of the flexible display device according to another embodiment of the present invention, taken along the line IIb-IIb' of FIG. 2A. Referring to FIGS. 2A and 2B, a flexible display device 200A includes multi-layered substrate structure having a support film 210A and a flexible substrate 220A. Also included in the flexible display device 200A is a display unit 230A.

The flexible substrate 220A is a substrate configured to support various elements such as a flexible display device 200A. The flexible substrate 220A may also be referred to as a flexible substrate, a first flexible substrate, or a flexible member. When the flexible substrate 220A is formed of a plastic, the flexible substrate 220A may also be referred to as a plastic film, or a plastic substrate. The flexible substrate 220A may be formed of a flexible material, for example, may be in the form of a film made of materials such as a polyester-based polymer, a silicone-based polymer, an acrylic polymer, a polyolefin-based polymer, and a copolymer thereof. The flexible substrate 220A includes a display area A and a peripheral circuit area B. The display area A of the flexible substrate 220A refers to a display area, that is, an area on which an image is actually displayed. The peripheral circuit area B of the flexible substrate 220A refers to a non-display area, that is, an area on which no image is displayed. The flexible substrate 220A is substantially identical to the flexible substrate 120C shown in FIG. 1C, and thus repeated description of the flexible substrate 120C is omitted for brevity.

The support film 210A is in contact with the flexible substrate 220A. One surface of the flexible substrate 220A on which the display unit 230A is disposed is referred to as a top surface or a front surface of the flexible substrate 220A while the other surface of the flexible substrate 220A coming in contact with the support film 210A may be referred to as a bottom surface or a rear surface of the flexible substrate 220A. The support film 210A may be referred to as a back film, a rear film, a second flexible substrate, or a protective film.

The support film 210A serves to support the flexible substrate 220A. The flexible substrate 220A may be in the form of a flexible plastic thin film. Since this plastic film is vulnerable to external moisture and air, a display unit 230A formed on the flexible substrate 220A may be damaged if exposed to the external moisture and air. Therefore, in the flexible display device 200A according to one embodiment, the support film 210A may be disposed at a rear surface of the flexible substrate 220A to reduce the damage of the elements such as a display unit 230A due to the penetration of external moisture and air. The support film 210A may be formed of substantially the same material as the flexible substrate 220A, but may be thicker than the flexible substrate 220A.

The support film 210A includes a bending area formed with a pattern 211A where the bending of the flexible substrate is localized. Bending of various elements included in the flexible display device 200A may be localized at or near the pattern 211A without affecting the display area A. The pattern 211A may also be referred to as an easily crookable shape, an easily bendable shape, a bendable print, or a bending line. The pattern 211A is substantially identical to the patterns 111C, 111D, 111E and 111F shown with reference to FIGS. 1C to 1F, and thus repeated description of the pattern 211A is omitted herein for the sake of brevity.

Figure 2C:
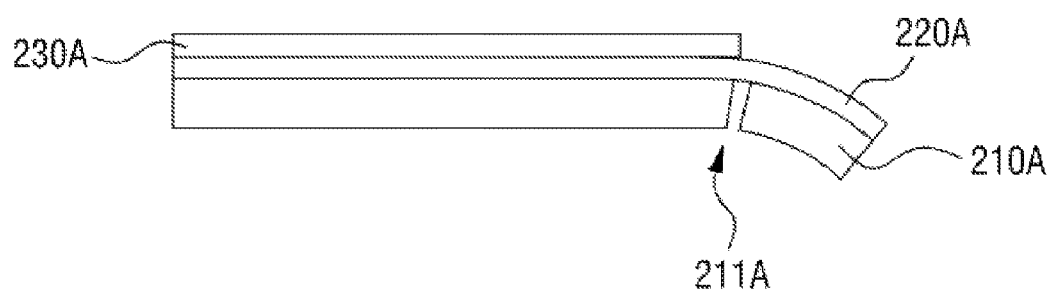
FIGS. 2C and 2D are cross-sectional views of the flexible display device of FIG. 2B in a bent state.
Figure 2D:
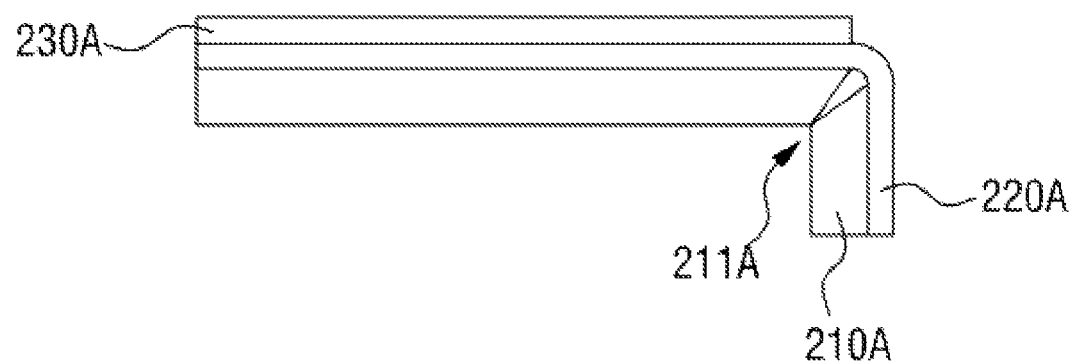

FIGS. 2C and 2D are cross-sectional views of the flexible display device of FIG. 2B in a bent state, according to one embodiment. Referring to FIGS. 2C and 2D, the shape of the flexible substrate 220A is determined by the shape of the support film 210A. More particularly, the shape of the flexible substrate 220A is determined by the shape of a sectional profile of the support film 210A. Since the flexible substrate 220A is a flexible plastic thin film, the shape of the flexible substrate 220A is relatively flexible and the flexible substrate 220A may not maintain its shape without any supporting structure. On the other hand, since the support film 210A is thicker than the flexible substrate 220A and more rigid, it is relatively easy to maintain the shape of the support film 210A. Therefore, the shape of the flexible substrate 220A disposed on the support film 210A is determined by the shape of the support film 210A, and the flexible substrate 220A may also be bent in the same way as the support film 210A.

Referring to FIG. 2D, the support film 210A has a certain shape according to the pattern 211A, and the flexible substrate 220A has a shape corresponding to the certain shape of the support film 210A. When the peripheral circuit area B of the flexible substrate 220A is crooked in a state in which the flexible substrate 220A is disposed on the support film 210A, the support film 210A and the flexible substrate 220A may be bent with respect to the pattern 211A formed on the support film 210A. FIG. 2D shows that the flexible substrate 220A and the support film 210A are bent at a right angle, that is, bent in a " ⌐ " shape, with respect to the pattern 211A, but the present invention is not limited thereto. For example, the support film 210A and the flexible substrate 220A may be bent at various angles such as an acute angle and an obtuse angle with respect to the pattern 211A.

The support film 210A may have various sectional shapes. When an external force is applied to the support film 210A, the support film 210A may have a "—" letter-shaped section. On the other hand, when an external force is applied to the support film 210A, the support film 210A is bent at the boundary defined as the pattern 211A, and thus may have a curved shape or a curved state. For example, the support film 210A may have a " ⌐ "-shaped section. Also, when an external force is applied to the support film 210A, the support film 210A may have a non-linear section. Here, the term "non-linear section" encompasses a case in which shapes other than a straight line are present in a section of the support film 210A, and may refer to a circular or curved section having a certain radius of curvature.

In some embodiments, the support film 210A may be bent at the boundary defined as the pattern 211A, and the flexible substrate 220A having the display unit 230A disposed thereon may then be attached to the bent support film 210A. That is, the support film 210A may be bent at the boundary defined as the pattern 211A into various shapes, and the flexible substrate 220A may then be attached to the bent support film 210A. Therefore, a tension of the bent flexible substrate 220A may be decreased. In some embodiments, to fix the bent support film 210A as necessary, a double-sided adhesive tape may be used. In this case, the flexible substrate 220A may be attached to the support film 210A in a bent state by means of the double-sided adhesive tape.

Figure 2E:
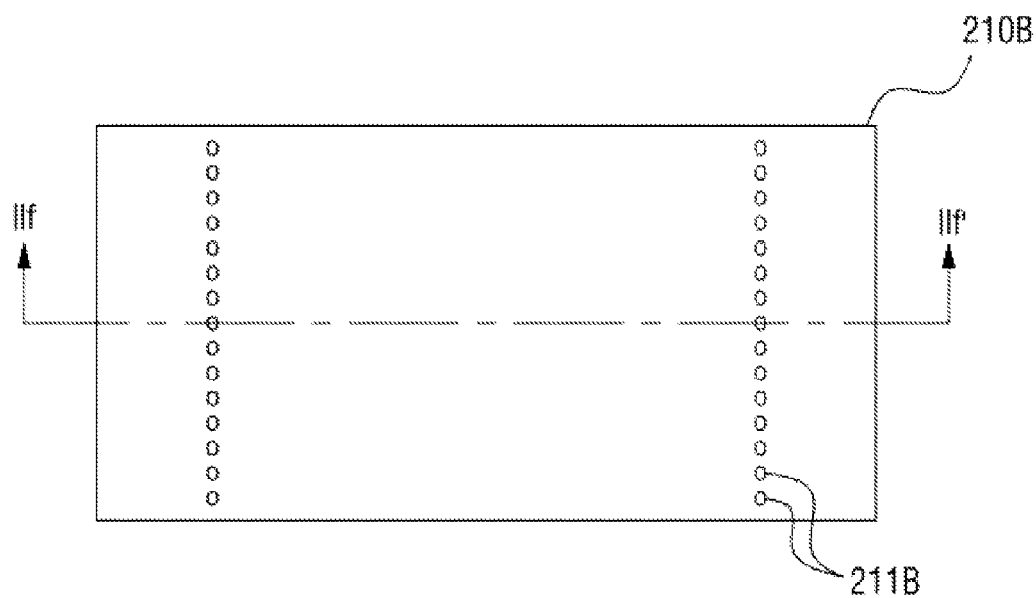
FIG. 2E is a top view of a support film used to illustrate the flexible display device according to an embodiment of the present invention.
Figure 2F:
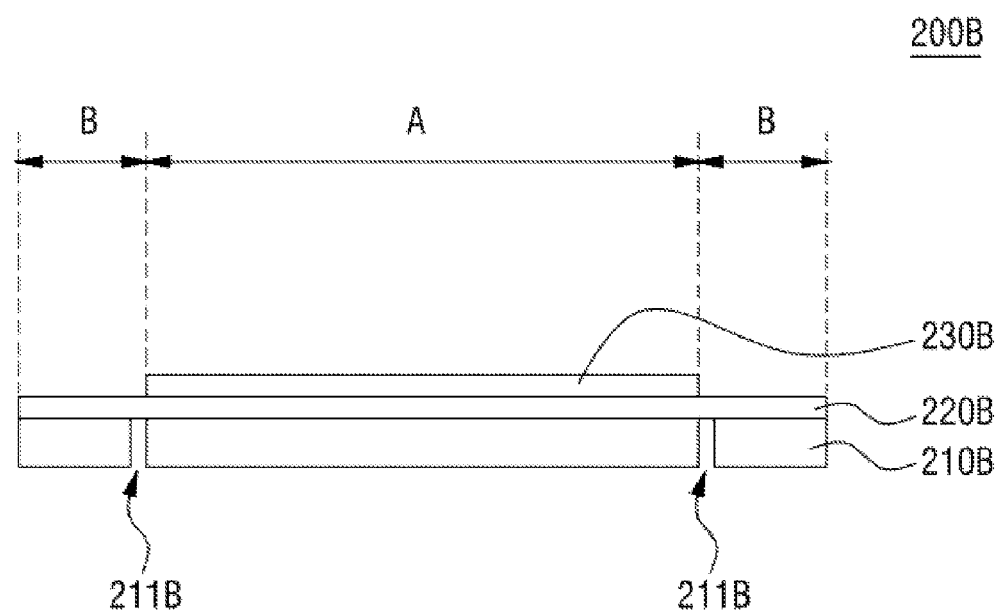
FIG. 2F is a cross-sectional view of the flexible display device taken along the line IIf-IIf' of FIG. 2E.
Figure 2G:
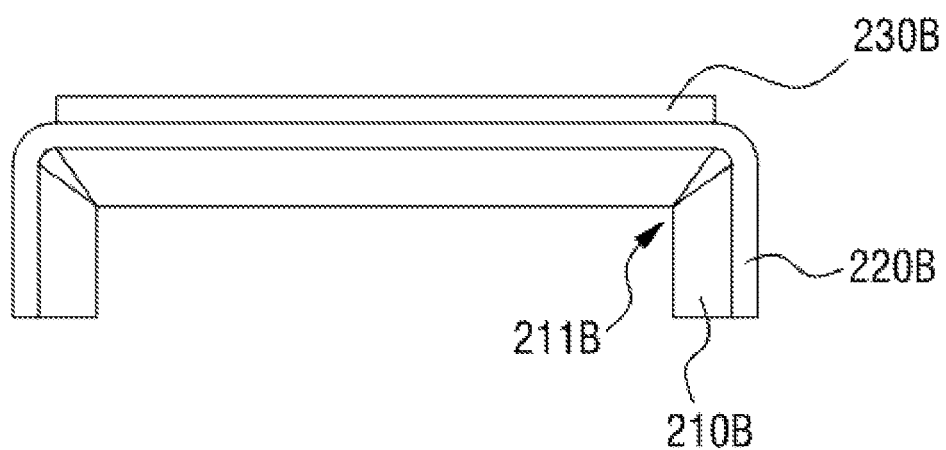
FIG. 2G is a cross-sectional view illustrating the flexible display device of FIG. 2F in a bent state.

FIG. 2E is a top view of a support film used to illustrate the flexible display device according to another embodiment of the present invention. FIG. 2F is a cross-sectional view of the flexible display device according to still another embodiment of the present invention, taken along the line IIf-IIf' of FIG. 2E. FIG. 2G is a cross-sectional view showing a bent state of the flexible display device shown in FIG. 2F. Referring to FIGS. 2E to 2G, a flexible display device 200B includes a flexible substrate 220B, a display unit 230B and a support film 210B. Among the elements of the flexible display device 200B, only the support film 210B is shown in FIG. 2E for the sake of convenience of description.

Referring to FIGS. 2E and 2F, the flexible substrate 220B includes a display area A and a peripheral circuit area B. The display area A of the flexible substrate 220B refers to a display area, that is, an area on which an image is actually displayed, and the display unit 230B may be disposed on the display area A of the flexible substrate 220B. The peripheral circuit area B of the flexible substrate 220B may be positioned at both sides of the first areas A of the flexible substrate 220B. For the sake of convenience of description, FIG. 2E shows that both sides of the display area A of the flexible substrate 220B on which the peripheral circuit area B of the flexible substrate 220B is positioned are indicated by both sides positioned opposite to the display area A of the flexible substrate 220B, but the present invention is not limited thereto. For example, both sides of the display area A of the flexible substrate 220B may be defined as both sides positioned close to the display area A of the flexible substrate 220B. The flexible substrate 220B is substantially identical to the flexible substrate 220A shown in FIGS. 2A to 2D, except that the second areas B of the flexible substrate 220B are positioned at both sides of the display area A of the flexible substrate 220B, and thus repeated description of the flexible substrate 220B is omitted herein for the sake of brevity.

The support film 210B includes a bending pattern 211B for facilitating bending thereof. The bending pattern 211B may include via holes, a groove or a combination thereof. The bending pattern 211B may be formed in an area of the support film 210B corresponding to the boundary between the display area A and the peripheral circuit area B of the flexible substrate 220B. The bending pattern 211B may be formed in an area of the support film 210B at or near the boundary between the display area A and the peripheral circuit area B of the flexible substrate 220B so as to facilitate bending of the support film 210B and the flexible substrate 220B disposed on the support film 210B. More particularly, the bending pattern 211B may serve to facilitate the bending of the support film 210B and the flexible substrate 220B with respect to the boundary between the display area A and the peripheral circuit area B. As described above, since the peripheral circuit areas B of the flexible substrate 220B are located at both sides of the display area A of the flexible substrate 220B, the patterns 211B may be formed in areas corresponding to the two boundaries between the display area A and the peripheral circuit areas B of the flexible substrate 220B. The support film 210B is substantially identical to the support film 210A shown in FIGS. 2A to 2D, except that the patterns 211B of the support film 210B are formed in the areas at or near the two boundaries between the display area A and the peripheral circuit area B of the flexible substrate 220B, and thus repeated description of the support film 210B is omitted herein for the sake of brevity.

Referring to FIG. 2G, the support film 210B is bent according to the bending pattern 211B, and the flexible substrate 220B is also bent into a shape corresponding to the curvature of the support film 210B. For the sake of convenience of description, FIG. 2G shows that the flexible substrate 220B and the support film 210B are bent at a right angle, that is, bent in a "⌐" shape, with respect to the bending pattern 211B, but the present invention is not limited thereto. For example, the support film 210B and the flexible substrate 220B may be bent at various angles such as an acute angle and an obtuse angle with respect to the bending pattern 211B. For the sake of convenience of description, FIG. 2G also shows that both of the second areas B of the flexible substrate 220B are bent according to the certain shape of the support film 210B, but the present invention is not limited thereto. For example, only one of the peripheral circuit areas B of the flexible substrate 220B may be bent.

Figure 2H:
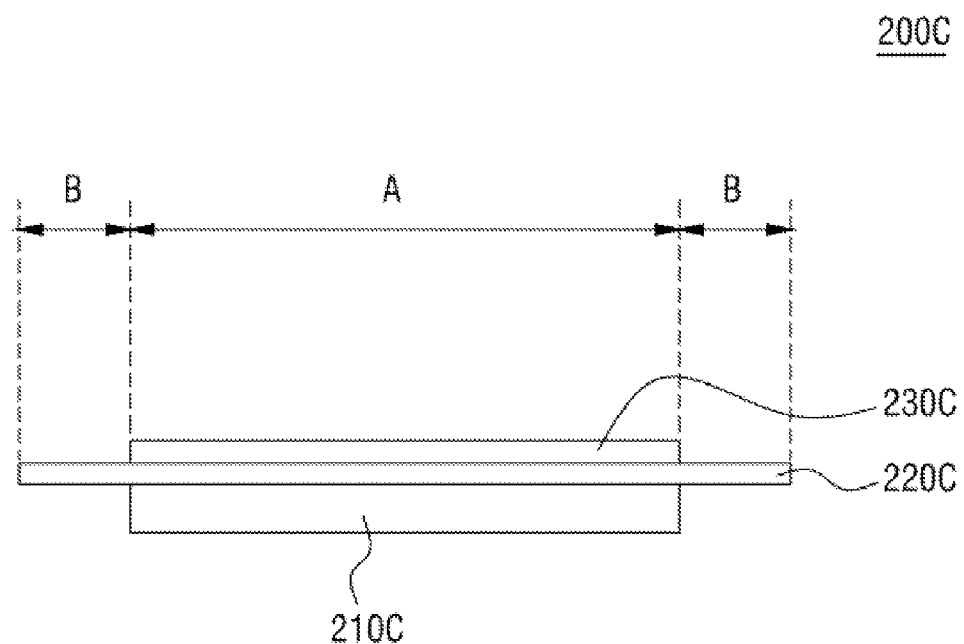
FIG. 2H is a cross-sectional view of a flexible display device according to an embodiment of the present invention.
Figure 2I:
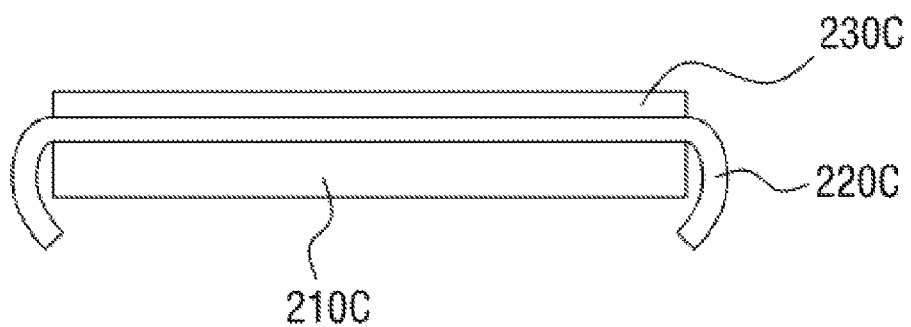
FIG. 2I is a cross-sectional view showing the flexible display device of FIG. 2H in a bent state.

FIG. 2H is a cross-sectional view of a flexible display device according to yet another embodiment. FIG. 2I is a cross-sectional view showing a bent state of the flexible display device shown in FIG. 2H. A flexible substrate 220C and a display unit 230C are substantially identical to the flexible substrate 220B and the display unit 230B shown in FIGS. 2E to 2G, and thus repeated description of the flexible substrate 220C and the display unit 230C is omitted for brevity.

Referring to FIGS. 2H and 2I, a support film 210C has a size that is substantially equal to the display area A of the flexible substrate 220C, and a peripheral circuit areas B of the flexible substrate 220C are not supported by the support film 210C. As described above, the support film 210C is thicker than the flexible substrate 220C. Therefore, when the support film 210C is bent, an elastic restoring force may be generated, it is difficult to maintain a bent state of the support film 210C, or a configuration of the display unit 230C or the polarizer that may be disposed on the flexible substrate 220C may be peeled off in a bent state. In the case of a flexible display device 200C according to still another embodiment of the present invention, the support film 210C has a size corresponding to the display area A of the flexible substrate 220C on which the display unit 230C is disposed, and overlaps only with the display area A of the flexible substrate 220C, and the peripheral circuit areas B of the flexible substrate 220C do not have the support film 210C attached thereto. Therefore, even when the peripheral circuit areas B of the flexible substrate 220C are bent, there is no portion of the support film 210C that is bent along with the peripheral areas B of the flexible substrate 220. Therefore, peeling of the display unit 230C or the polarizer due to the bending of the support film 210C may be prevented or reduced.

Figure 2J:
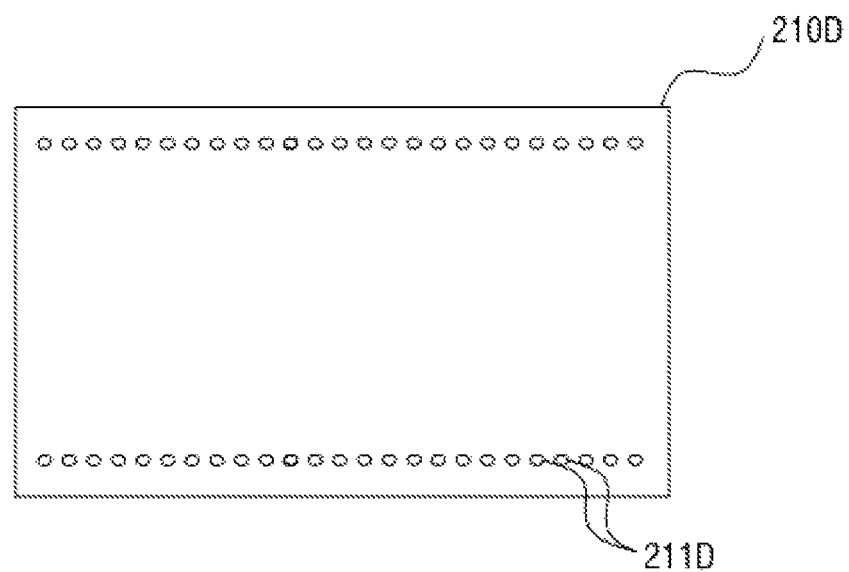
FIG. 2J is a top view of the support film used to illustrate the flexible display device according to an embodiment of the present invention.

FIG. 2J is a top view of the support film used to illustrate the flexible display device according to still another embodiment of the present invention. Among the elements of the flexible display device, only a support film 210D is shown in FIG. 2J for the sake of convenience of description.

Referring to FIG. 2J, the support film 210D includes two bending patterns 211D for facilitating bending thereof. In this example, each of the bending patterns 211D is formed with a plurality of via holes.

As previously described, however, each bending pattern 211D can be different bending pattern type (e.g., a plurality of holes, half-cut channel, recessed region). It should be appreciated that each of the plurality of via holes can have different shape and size depending on the desired flexibility of the support film 210D. For example, some part of the flexible display device may be need additional flexibility than some other parts of the flexible display device. As such, the bending pattern disposed at the part requiring more flexibility may be formed with more number of via holes or via holes having a larger size. When other types of the bending patterns are used, the part of the display device requiring more flexibility may employ a half-cut channel penetrating deeper (i.e., half-cut channel having larger depth) than the half-cut channel used in other parts of the display device. Likewise, larger area of the support film can be carved out at the part of the display device requiring more flexibility.

The bending pattern 211D may be formed in an area of the support film 210D corresponding to the boundary between a first area (e.g., display area or peripheral circuit area) and a second area (e.g., display area or peripheral circuit area) of a flexible substrate 220D. The bending pattern 211D may be formed in the area of the support film 210D corresponding to the boundary between the first area and the second area of the flexible substrate 220D so as to facilitate bending of the flexible substrate 220D disposed on the support film 210D and the support film 210D. More particularly, the pattern 211D may serve to facilitate bending of the support film 210D and the flexible substrate 220D with respect to the boundary between the first area and the second area. As described above, since the second areas of the flexible substrate 220D are positioned on both sides of the first area of the flexible substrate 220D, the patterns 211D may be formed in areas corresponding to the two boundaries between the first area and the second area of the flexible substrate 220D. The support film 210B is substantially identical to the support film 210B shown in FIGS. 2E to 2G, except that the patterns 211D are positioned at both sides of the support film 210D, and thus repeated description of the support film 210B is omitted for brevity.

Figure 2K:
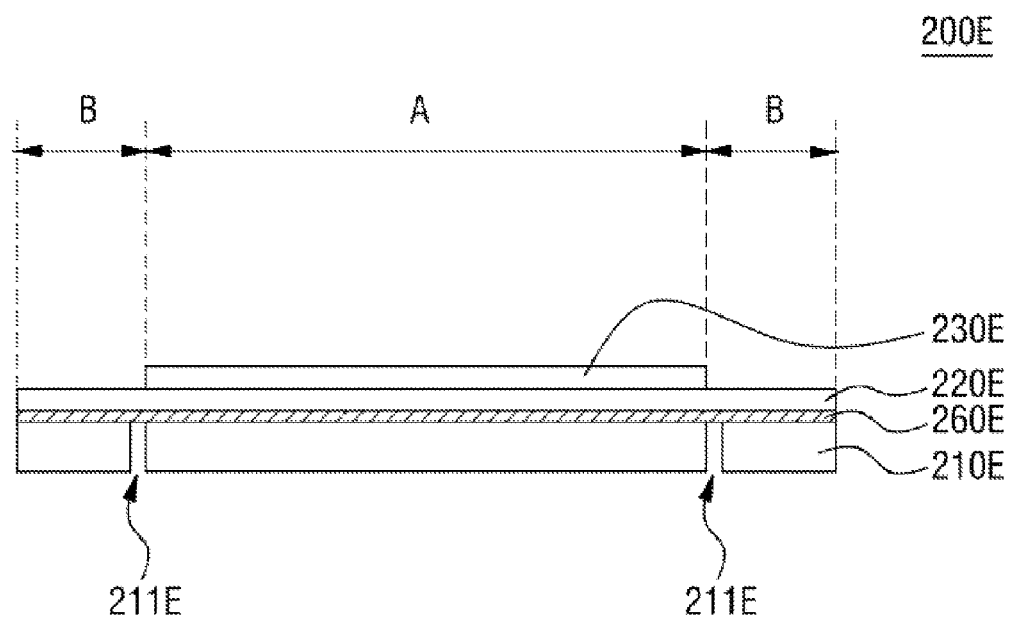
FIGS. 2K and 2L are cross-sectional views of flexible display devices according to various embodiments of the present invention.

FIG. 2K is a cross-sectional view of a flexible display device according to an embodiment of the present invention. Referring to FIG. 2K, a flexible display device 200E includes a flexible substrate 220E, a display unit 230E, a metal thin film layer 260E and a support film 210E. The flexible substrate 220E, the display unit 230E and the support film 210E are substantially identical to the flexible substrate 220B, the display unit 230B and the support film 210B shown in FIG. 2F, and thus repeated description of the flexible substrate 220E, the display unit 230E and the support film 210E is omitted herein for the sake of brevity.

Referring to FIG. 2K, the metal thin film layer 260E is disposed between the flexible substrate 220E and the support film 210E. That is, the metal thin film layer 260E is disposed on a rear surface of the flexible substrate 220E, and the support film 210E is disposed on a rear surface of the metal thin film layer 260E. In the flexible display device 200E according to yet another embodiment of the present invention, the metal thin film layer 260E may be disposed at the rear surface or a part of the rear surface of the flexible substrate 220E to reduce penetration of moisture or oxygen into the flexible substrate 220E. Also, since the metal thin film layer 260E has a characteristic effective for electrostatic charge, the likelihood of damage of the metal thin film layer 260E caused by electrostatic discharge (ESD) may be reduced. Also, the material forming the metal thin film layer 260E can be chosen in consideration of the thickness of the metal thin film layer 260E so that the metal thin film layer 260E does not excessively increase the rigidity of the flexible display device. However, the material and the thickness of the metal thin film layer 260E may reduce the elastic force to further facilitate bending of the flexible display device 200E.

Figure 2L:
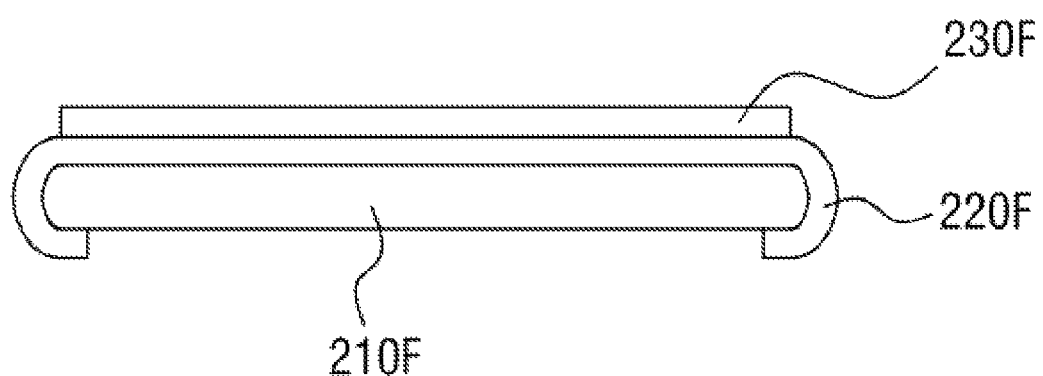

FIG. 2L is a cross-sectional view of a flexible display device according to yet another embodiment of the present invention. Referring to FIG. 2L, a flexible display device 200F includes a flexible substrate 220F, a display unit 230F, and a support film 210F. The flexible substrate 220F and the display unit 230F are substantially identical to the flexible substrate 220C and the display unit 230C shown in FIG. 2I, and thus repeated description of the flexible substrate 220F and the display unit 230F is omitted herein for the sake of brevity.

Referring to FIG. 2L, the support film 210F is formed of a moldable resin. In this case, lateral sides of the support film 210F may be formed with a curved shape. Here, the moldable resin means such as urethane or rubber may be used for the support film 210F. The support film 210F can be formed using a method such as injection molding. As shown in FIG. 2I, the flexible substrate 220F having the display unit 230F formed thereon is attached on the support film 210F having a curved edge. In other words, the support film 210F may have a sufficient thickness and its lateral sides may be formed in a curved shape so that the edge portions of the display device can have a curved shape without bending the support film 210F. Therefore, a strain at the corner of the flexible substrate 220F may be reduced.

Figure 3A:
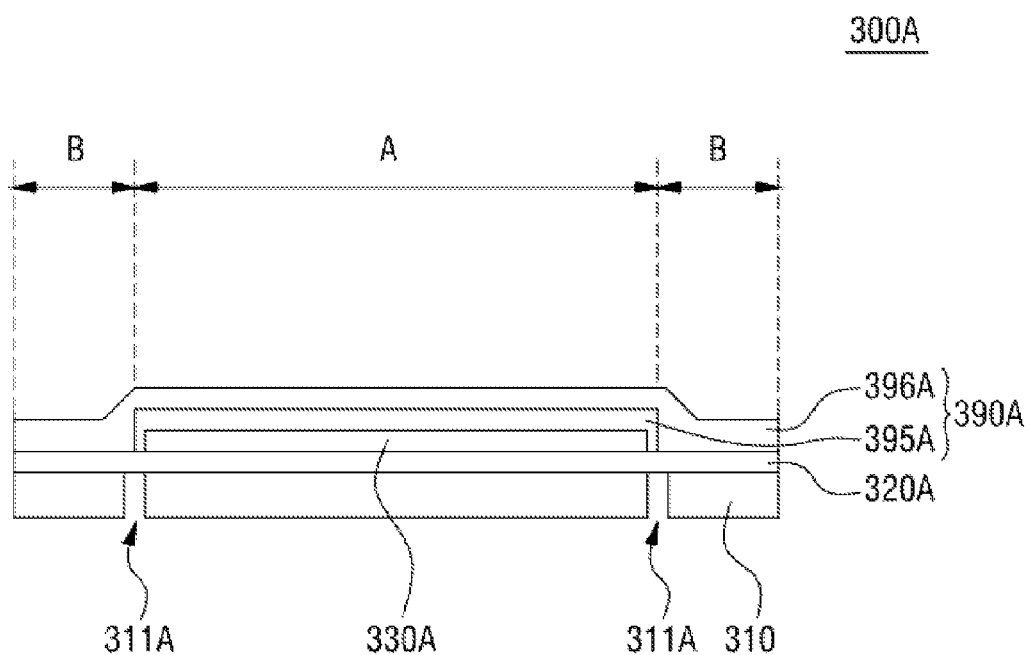
FIGS. 3A to 3D are cross-sectional views of flexible display devices according to various embodiments of the present invention.
Figure 3B:
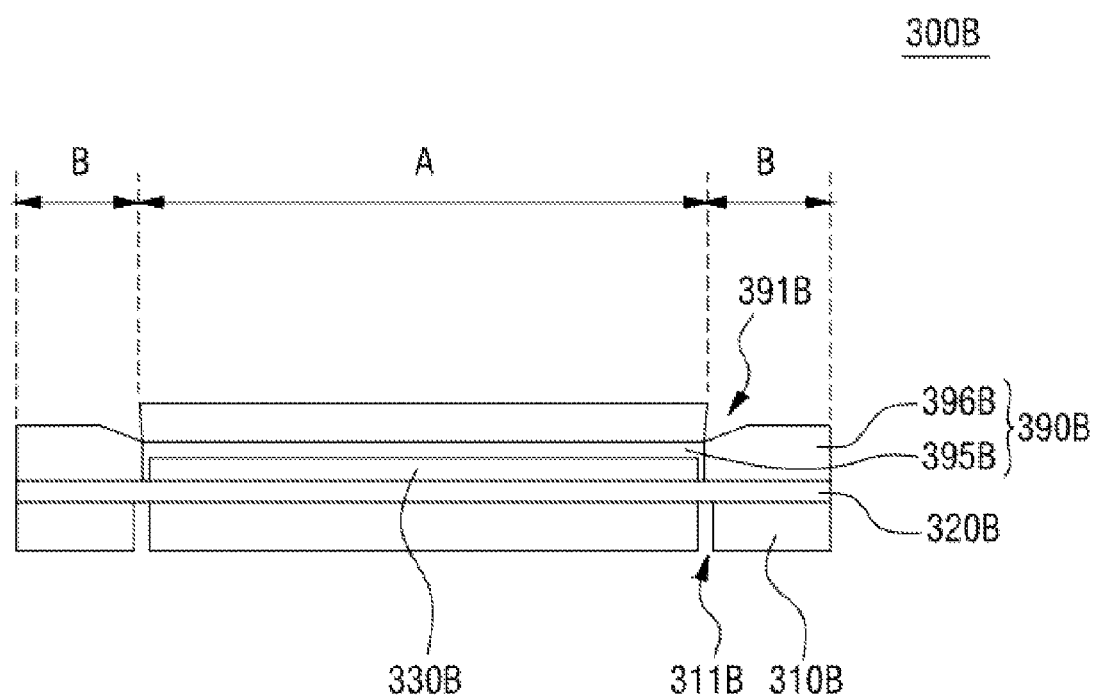
Figure 3C:
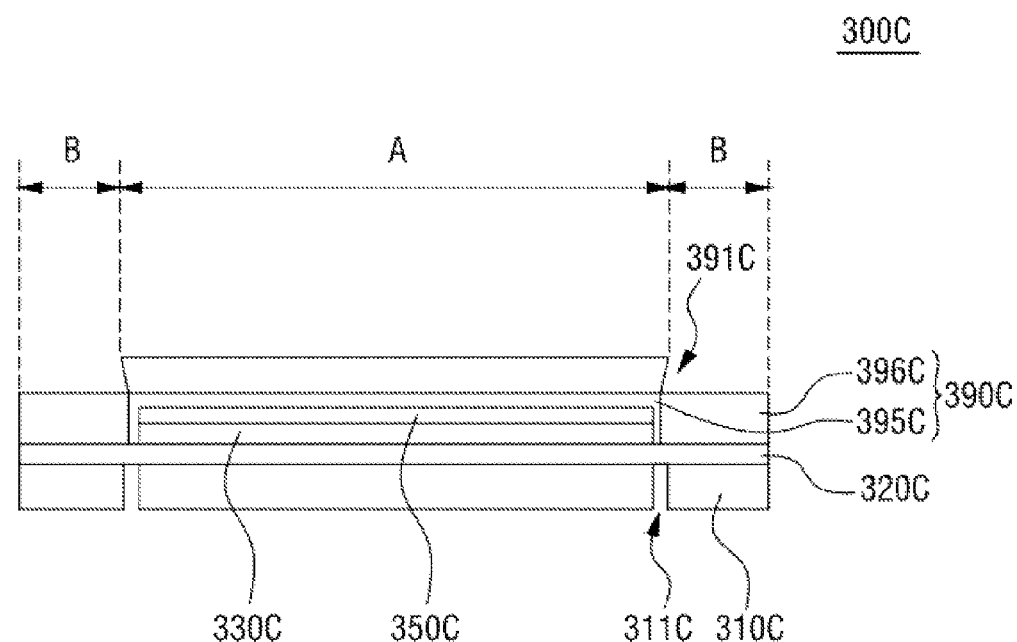

FIGS. 3A to 3C are cross-sectional views of flexible display devices according to various embodiments. Referring to FIGS. 3A to 3C, patterns 311A, 311B, 391B, 311C and 391C for facilitating bending are formed in at least one of protective layers 390A, 390B and 390C and support films 310A, 310B and 310C.

First, referring to FIG. 3A, a flexible display device 300A includes a flexible substrate 320A, a display unit 330A, a support film 310A and a protective layer 390A. In this case, a pattern 311A for facilitating bending is formed in the support film 310A. The flexible substrate 320A, the display unit 330A and the support film 310A are substantially identical to the flexible substrate 220B, the display unit 230B and the support film 210B shown in FIGS. 2E to 2G, and thus repeated description of the flexible substrate 320A, the display unit 330A and the support film 310A is omitted herein for the sake of brevity.

The protective layer 390A coming in contact with the flexible substrate 320A and covering a display area A and a peripheral circuit area B of the flexible substrate 320A is disposed. The protective layer 390A includes a sealant 395A and a protective film 396A. The protective layer 390A may be configured to be wider according to a method of sealing internal elements of the flexible display device 300A. For example, a method of sealing the flexible display device 300A includes thin film encapsulation (TFE), face sealing, etc. As described herein, a protective layer formed using a face sealing method favorable for flexible display applications among various sealing methods is used as the protective layer 390A, but the present invention is not limited thereto. The protective layer 390A may also be formed using other encapsulation methods. The protective film 396A is glued onto the sealant 395A in the form of a thin film, and the protective film 396A serves to protect the internal elements of the flexible display device 300A. The protective film 396A may be formed of a flexible material, for example, a plastic, a metal, a metal oxide, a ceramic oxide and a polymer material, or a combination of a plastic, a metal, a metal oxide, a ceramic oxide and/or a polymer material.

The sealant 395A in the protective layer 390A is formed at the display area A of the flexible substrate 320A, and the protective films 396A are formed at the display area A and the peripheral circuit area B of the flexible substrate 320A. The sealant 395A serves to seal the internal elements of the flexible display device 300A, especially the display unit 330A. The sealant 395A is formed at the display area A of the flexible substrate 320A on which the display unit 330A is disposed. The sealant 395A may be formed at the display area A of the flexible substrate 320A. In some embodiments, however, the sealant 395A may also be formed at both the display area A and the peripheral circuit area B of the flexible substrate 320A.

Next, referring to FIG. 3B, a flexible display device 300B includes a flexible substrate 320B, a display unit 330B, a support film 310B and a protective layer 390B, and patterns 311B and 391B for facilitating bending are formed in the support film 310B and the protective layer 390B. The flexible substrate 320B, the display unit 330B and the support film 310B are substantially identical to the flexible substrate 320A, the display unit 330A and the support film 310A shown in FIG. 3A, and thus repeated description of the flexible substrate 320B, the display unit 330B and the support film 310B is omitted herein for the sake of brevity.

A pattern 391B is formed in an area of a protective film 396B of the protective layer 390B corresponding to the boundary between a display area A and a peripheral circuit area B of the flexible substrate 320B. The pattern 391B may be formed in the area of the protective film 396B of the protective layer 390B corresponding to the boundary between the display area A and the peripheral circuit area B of the flexible substrate 320B to facilitate bending of a polarizer 390B, the flexible substrate 320B and the support film 310B, particularly, to localize bending of the protective layer 390B, the flexible substrate 320B and the support film 310B with respect to the boundary between the display area A and the peripheral circuit area B.

Subsequently, referring to FIG. 3C, a flexible display device 300C includes a flexible substrate 320C, a display unit 330C, a support film 310C, a polarizer 350C and a protective layer 390C, and patterns 311 and 391C for facilitating bending are formed in the support film 310C and the protective layer 390C. The flexible substrate 320C, the display unit 330C, the support film 310C and the protective layer 390C are substantially identical to the flexible substrate 320B, the display unit 330B, the support film 310B and the protective layer 390B shown in FIG. 3B, and thus repeated description of the flexible substrate 320C, the display unit 330C, the support film 310C and the protective layer 390C is omitted herein for the sake of brevity.

The polarizer 350C in contact with the flexible substrate 320C and covering a display area A of the flexible substrate 320C is disposed. The polarizer 350C may also be referred to as a polarizer film. In case where the display unit 330C is an organic light emitting diode, a contrast ratio (CR) is markedly degraded when an external light incident from the outside is reflected on a metal electrode or a wire of the organic light emitting diode. In the flexible display device 300C according to another embodiment of the present invention, degradation of the contrast ratio caused by reflection of external light may be reduced or eliminated by disposing the polarizer 350C on the display area A of the flexible substrate 320C, that is, the display unit 330C. Also, the polarizer 350C may be formed only on the display area A of the flexible substrate 320C to reduce or prevent peeling of the polarizer 350C when a peripheral circuit area B of the flexible substrate 320C is bent.

Figure 3D:
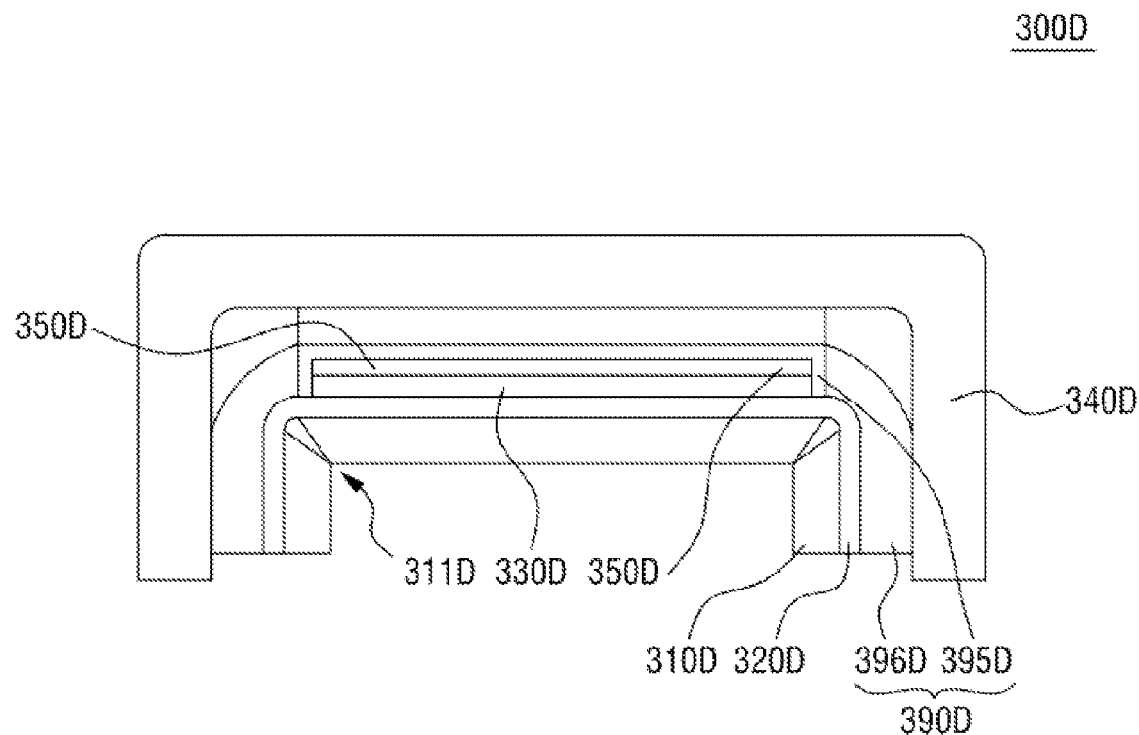

FIG. 3D is a cross-sectional view showing a bent state of the flexible display device according to another embodiment. Referring to FIG. 3D, a flexible display device 300D includes a flexible substrate 320D, a display unit 330D, a support film 310D, a polarizer 350D, a protective layer 390D and a cover 340D. The flexible substrate 320D, the display unit 330D, the support film 310D, the polarizer 350D and the protective layer 390D are substantially identical to the flexible substrate 320C, the display unit 330C, the support film 310C, the polarizer 350C and the protective layer 390C shown in FIG. 3C, respectively, and thus repeated description of the above-described elements is omitted herein for the sake of brevity. Also, the cover 340D substantially identical to the cover 140I shown in FIG. 1I, and thus repeated description of the cover 340D is omitted herein for the sake of brevity.

Figure 4A:
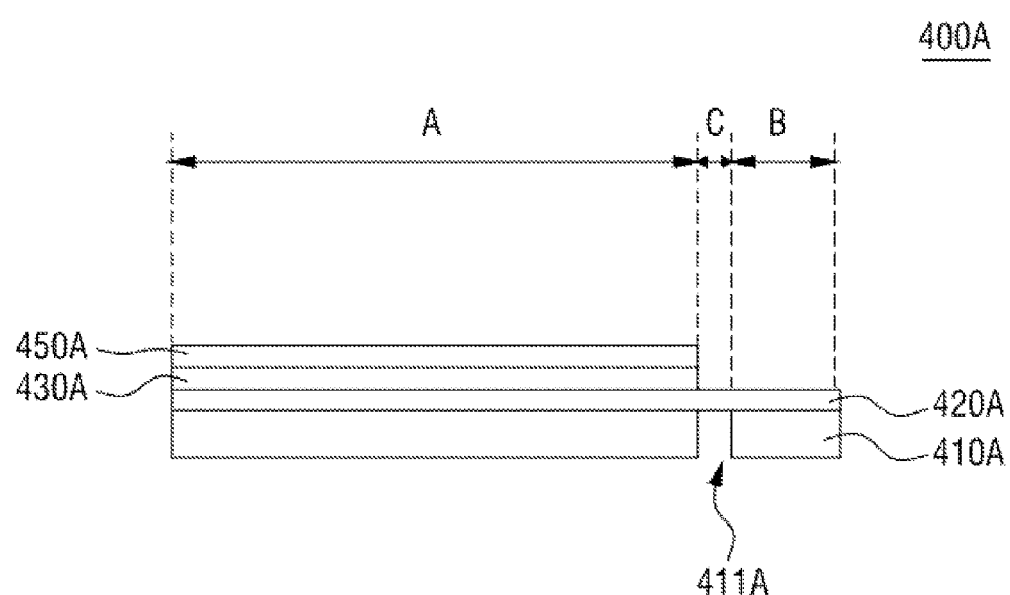
FIG. 4A is a cross-sectional view of a flexible display device according to an embodiment of the present invention.
Figure 4B:
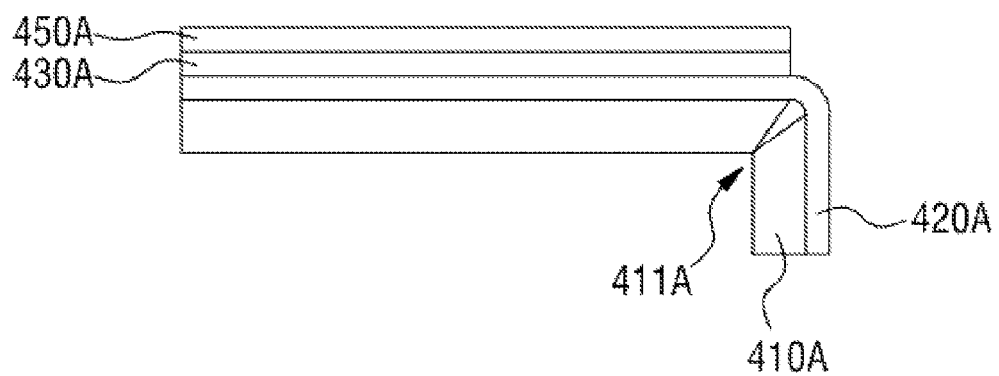
FIG. 4B is a cross-sectional view showing the flexible display device of FIG. 4A in a bent state.

FIG. 4A is a cross-sectional view of a flexible display device according to another embodiment. FIG. 4B is a cross-sectional view showing a bent state of the flexible display device shown in FIG. 4A. Referring to FIGS. 4A and 4B, a flexible display device 400A includes a support film 410A, a flexible substrate 420B, a display unit 430B and a polarizer 450B.

A flexible substrate 420A supports various elements of a flexible display device 400A. The flexible substrate 420A may also be referred to as a flexible substrate, a first flexible substrate, or a flexible member. When the flexible substrate 420A is formed of a plastic, the flexible substrate 420A may be referred to as a plastic film, or a plastic substrate.

The flexible substrate 420A may be formed of a flexible material such as a polyester-based polymer, a silicone-based polymer, an acrylic polymer, a polyolefin-based polymer, and a copolymer thereof. More particularly, the flexible substrate 420A may be formed of polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, a cyclic olefin copolymer (COC), a cyclic olefin polymer (COP), polyethylene (PE), polypropylene (PP), polyimide (PI), polymethylmetacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and a combination thereof. When the flexible display device 400A is to be transparent, the flexible substrate 420A may be formed of a transparent flexible material.

The flexible substrate 420A includes a display area A, a peripheral circuit area B and a third area C. The display area A of the flexible substrate 420A refers to a display area, that is, an area on which an image is actually displayed. The peripheral circuit area B and the third area C of the flexible substrate 420A refer to non-display areas, that is, areas on which no image is displayed.

The peripheral circuit area B of the flexible substrate 420A is a non-display area which is positioned at the outermost area of the flexible substrate 420A. The peripheral circuit area B of the flexible substrate 420A is positioned at an edge portion of the flexible substrate 420A, and thus may also be referred to as an edge area or a bezel area.

The third area C of the flexible substrate 420A is a non-display area which is positioned between the display area A and the peripheral circuit area B of the flexible substrate 420A. The third area C of the flexible substrate 420A is positioned at a peripheral portion of the first area of the flexible substrate 420A, and positioned between the display area A and the peripheral circuit area B of the flexible substrate 420A, and thus may also be referred to as a peripheral area, a middle area, or a bezel area.

A display unit 430A is disposed at all or part of the display area A of the flexible substrate 420A. The display unit 430A is an element for actually generating an image, and thus may be referred to as an image display unit 430A, or a display panel. The display unit 430A may be used without limitation as long as it can be configured to display an image. It is described herein that the display unit 430A is an organic light emitting diode for displaying an image through an organic light emitting layer, and define that the image is displayed on an entire area corresponding to the display unit 430A. A polarizer 450A capable of improving a contrast ratio is disposed on the display unit 430A.

The support film 410A serves to support the flexible substrate 420A. As described above, the flexible substrate 420A is in the form of a flexible plastic thin film. However, since this plastic film is vulnerable to penetration of moisture and air from the outside, there is a possibility of elements, such as a display unit 430A, formed on the flexible substrate 420A becoming damaged. Therefore, in the flexible display device 400A according to still another embodiment of the present invention, the support film 410A may be disposed at a rear surface of the flexible substrate 420A to minimize damage of the elements such as a display unit 430A caused by the penetration of moisture and air from the outside. The support film 410A may be formed of substantially the same material as the flexible substrate 420A, but have a relatively larger thickness than the flexible substrate 420A.

The support film 410A may be formed with a shape and size corresponding to those of the flexible substrate 420A. Since the support film 410A functions to support the flexible substrate 420A, the shape and size of the support film 410A may correspond to those of the flexible substrate 420A, but the present invention is not limited thereto. For example, the shape and size of the flexible substrate 420A and the shape and size of the support film 410A may be determined in an independent manner.

The support film 410A includes a pattern 411A for facilitating bending thereof. The pattern 411A for facilitating the bending may be referred to as a pattern 411A for facilitating bending of the support film 410A. As a result, bending of various elements included in the flexible display device 400A may also be facilitated by facilitating the bending of the support film 410A. The pattern 411A for facilitating the bending may also be referred to as an easily crookable shape, an easily bendable shape, a bendable print, or a bending line.

The pattern 411A may include at least one of a via hole and a groove of the support film 410A. The via hole and groove may be formed in various shapes such as a cylindrical shape, a polyprismatic shape, a conical shape, and a polypyramid shape, and the sizes of the via hole and groove may be determined according to various designs.

The pattern 411A may be formed using various processes capable of forming a via hole or a groove in the support film 410A. As various processes for forming the pattern 411A, laser processes and mechanical processes such as a piercing process, a punching process, and a press process may be used.

The pattern 411A may be formed in an area of the support film 410A corresponding to the third area C between the display area A and the peripheral circuit area B of the flexible substrate 420A. The pattern 411A may be formed in the area of the support film 410A corresponding to the third area C of the flexible substrate 420A so as to facilitate bending of the support film 410A and the flexible substrate 420A disposed on the support film 410A, particularly, to facilitate bending of the support film 410A and the flexible substrate 420A with respect to the third area C. For the sake of convenience of description, FIG. 4A shows that the pattern 411A is formed in the third area C of the flexible substrate 420A in the form of one row, but the present invention is not limited thereto. For example, the pattern 411A may be in the form of a plurality of rows, and be irregularly formed in the third area C of the flexible substrate 420A.

An area of the support film 410A corresponding to the display area A or the peripheral circuit area B of the flexible substrate 420A may have a higher average volume than an area of the support film 410A corresponding to the third area C of the flexible substrate 420A. As described above, the pattern 411A is formed in the area of the support film 410A corresponding to the third area C of the flexible substrate 420A. Therefore, since a via hole or a groove is formed in the third area C of the flexible substrate 420A, the area of the support film 410A corresponding to the display area A or the peripheral circuit area B of the flexible substrate 420A may have a higher average than the area of the support film 410A corresponding to the third area C of the flexible substrate 420A. In some embodiments, the area of the support film 410A corresponding to the display area A or the peripheral circuit area B of the flexible substrate 420A may have a greater thickness than the area of the support film 410A corresponding to the third area C of the flexible substrate 420A.

As described above, the display area A of the flexible substrate 420A is a display area on which an image is actually displayed, but the peripheral circuit area B of the flexible substrate 420A is a non-display area. Even if the peripheral circuit area B of the flexible substrate 420A is positioned on the same plane as the display area A of the flexible substrate 420A, no image is visible on the peripheral circuit area B of the flexible substrate 420A. Therefore, a configuration of covering the peripheral circuit area B of the flexible substrate 420A should be present as a separate protective member that may be positioned on the flexible substrate 420A, which results in restriction on design of the flexible display device and can be aesthetically unpleasing to consumers. Accordingly, it is advantageous to decrease the bezel area by bending the peripheral circuit area B of the flexible substrate 420A toward a rear or lateral surface of the flexible substrate 420A. However, the support film 410A has a larger thickness than the flexible substrate 420A. Therefore, when the support film 410A is bent, an elastic restoring force may be generated, making it difficult to maintain a bent shape of the support film 410A. Alternatively or in addition, a configuration of the display unit 430A or the polarizer that may be disposed on the flexible substrate 420A may be peeled off in a bent state. In the flexible display device 400A according to one embodiment of the present invention, the pattern 411A for facilitating the bending may be formed in an area of the support film 410A corresponding to the third area C of the flexible substrate 420A to minimize an elastic restoring force of the support film 410A. As a result, it is possible to facilitate the bending of the flexible substrate 420A, improve peeling of the elements formed on the flexible substrate 420A, and provide a more improved design.

Figure 4C:
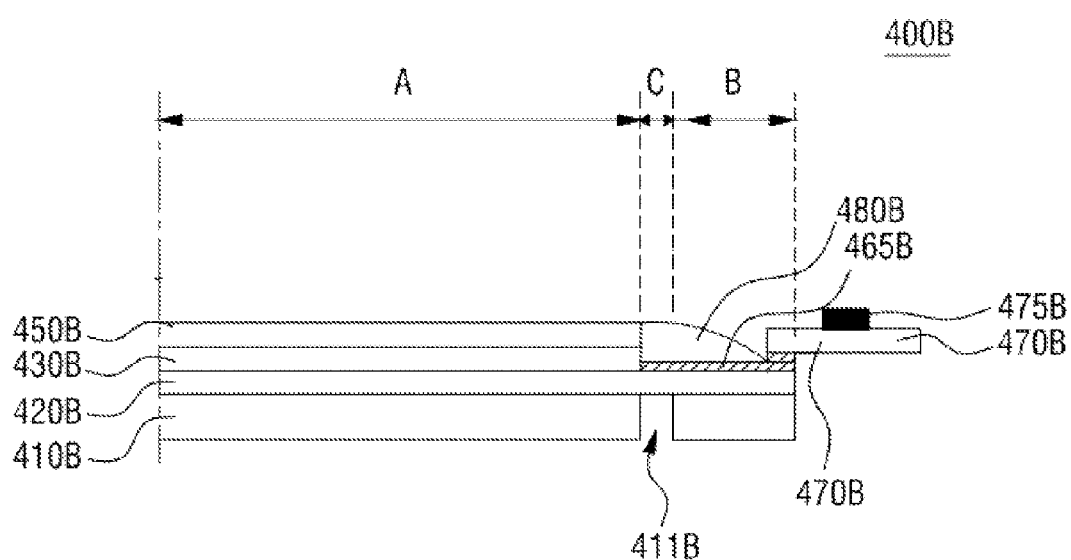
FIGS. 4C and 4D are cross-sectional views of flexible display devices according to various embodiments of the present invention.

FIG. 4C is a cross-sectional view of a flexible display device according to still another embodiment. Referring to FIG. 4C, a flexible display device 400B includes a support film 410B, a flexible substrate 420B, a display unit 430B, a polarizer 450B, a wire 465B, a drive circuit unit 470B and an organic film 480B. The support film 410B, the flexible substrate 420B, the display unit 430B, the wire 465B and the drive circuit unit 470B are substantially identical to the support film 110, the flexible substrate 120, the display unit 130, the wire 165 and the drive circuit unit 170 shown in FIG. 1B, and the polarizer 450B is substantially identical to the polarizer 450A shown in FIG. 4A, and thus repeated description of the above-described elements is omitted herein for the sake of brevity.

The drive circuit unit 470B configured to transfer various signals to the display unit 430B from the outside, and the wire 465B configured to provide electrical connection between the display unit 430B and the drive circuit unit 470B are formed. The wire 465B is electrically connected with a wire 471B of the drive circuit unit 470B. When flexible substrate 420B having the display unit 430B, the wire 465B and a pad portion 472B formed therein is bent, strain is caused in the display unit 430B and the wire 465B formed on the flexible substrate 420B. In the flexible display device 400B of FIG. 4B, however, the organic film 480B is formed on the wire 465B such that the flexible display substrate 420B and the wire 465B is positioned substantially in the neutral plane within the flexible display device 400. When the flexible display device 400B is bent, the tensile force from the support film 410B and the compressive force from the organic film 480B may be simultaneously applied to flexible display substrate 420B and the wire 465B so that the mechanical stress can be neutralized. Thus the wire 465B may be in a stress-free state so that the flexible substrate 420B and the wire 465B can be protected from mechanical stress caused from bending of the flexible display device 400B. Here, to offset the tensile force and the compressive force applied respectively to the flexible substrate 420B and the wire 465B, the organic film 480B may have the same or greater thickness than the support film 410B.

The organic film 480B is formed at a space between the display unit 430B and the drive circuit unit 470B. As described above, a pattern 411B is formed in an area corresponding to the third area C of the flexible substrate 420B, and the flexible display device 400B is bent with respect to the third area C of the flexible substrate 420B. As a result, an area in which the highest strain is formed at the third area C of the flexible substrate 420B. Therefore, it is preferred that the organic film 480B is formed to cover the third area C of the flexible substrate 420B. In some embodiments, when the space between the display unit 430B and the drive circuit unit 470B corresponds to a part of a second area and the third area C of the flexible substrate 420B as shown in FIG. 4C, the organic film 480B is formed on a part of the peripheral circuit area B as well as the third area C of the flexible substrate 420B.

Since the flexible substrate 420B is flexible, the display area of the flexible display device 400B may also be bent in addition to the third area C. In such cases, the organic film 480B may be disposed on the display area A as well as the third area C of the flexible substrate 420B so as to configure the areas to be the neutral plane within the flexible display device 400B is bent as a whole.

Figure 4D:
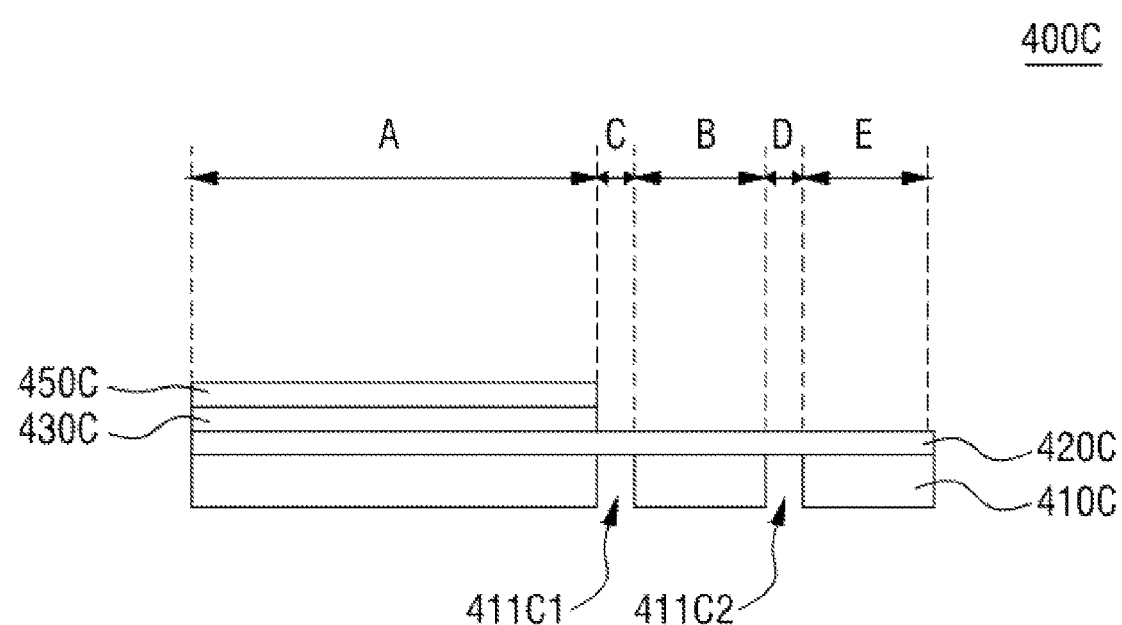
Figure 4E:
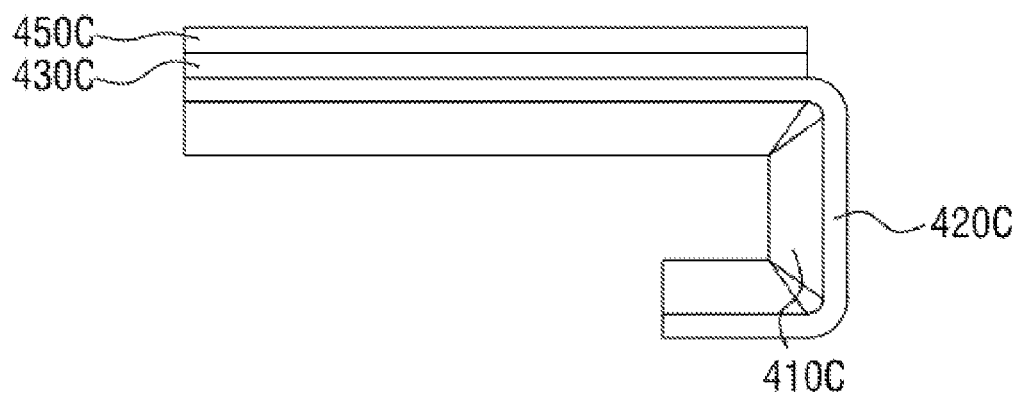
FIG. 4E is a cross-sectional view showing the flexible display device of FIG. 4D in a bent state.

FIG. 4D is a cross-sectional view of a flexible display device according to yet another embodiment. FIG. 4E is a cross-sectional view showing a bent state of the flexible display device shown in FIG. 4D. The elements shown in FIGS. 4A and 4D are substantially identical to each other when the elements have the same numerals other than the alphabet characters in the corresponding reference numerals, and thus repeated description of the elements is omitted herein for the sake of brevity.

A flexible substrate 420C includes a display area A, a peripheral circuit area B, a third area C, a fourth area D and a fifth area E. The display area A of the flexible substrate 420A refers to a display area, that is, an area on which an image is actually displayed. The peripheral circuit area B, the third area C, the fourth area D and the fifth area E of the flexible substrate 420C refer to non-display areas, that is, areas on which no image is displayed. The display area A, the peripheral circuit area B and the third area C of the flexible substrate 420C are substantially identical to the display area A, the peripheral circuit area B and the third area C of the flexible substrate 420A shown in FIG. 4A, and thus repeated description of the display area A, the peripheral circuit area B and the third area C of the flexible substrate 420C is omitted herein for the sake of brevity.

The fifth area E of the flexible substrate 420C is a non-display area which is positioned at the outermost area of the flexible substrate 420C. Since the fifth area E of the flexible substrate 420C is positioned at an edge portion of the flexible substrate 420C, the second area E of the flexible substrate 420C may also be referred to as an edge area or a bezel area.

The fourth area D of the flexible substrate 420C is a non-display area which is positioned between the third area C and the fifth area E of the flexible substrate 420C. Also, since the fourth area D of the flexible substrate 420C is positioned at a peripheral portion of the display area A of the flexible substrate 420C, and positioned between the display area A and the fifth area E of the flexible substrate 420C, the fourth area D of the flexible substrate 420C may be referred to as a peripheral area, a middle area or a bezel area.

A support film 410C is disposed to come in contact with the flexible substrate 420C. One surface of the flexible substrate 420C on which a display unit 430C is disposed is a top or front surface of the flexible substrate 420C while the other surface of the flexible substrate 420C with which the support film 410C comes in contact may be referred to as a bottom or rear surface of the flexible substrate 420C.

The support film 410C includes a bending pattern 411C for facilitating bending of the support film 410C. As a result, bending of various elements included in the flexible display device 400C may also be facilitated by facilitating the bending of the support film 410C. The pattern 411C for facilitating the bending may also be referred to as an easily crookable shape, an easily bendable shape, a bendable print, or a bending line.

The pattern 411C for facilitating the bending includes a pattern 411C1 for facilitating primary bending and a pattern 411C2 for facilitating secondary bending. The bending pattern 411C1 for facilitating the primary bending and the bending pattern 411C2 for facilitating the secondary bending may be formed in areas of the support film 410C corresponding to the third area C and the fourth area D of the flexible substrate 420C, respectively. The bending pattern 411C1 for facilitating the primary bending and the bending pattern 411C2 for facilitating the secondary bending may be formed with the same shape and size, or formed with different shapes and sizes.

Figure 4F:
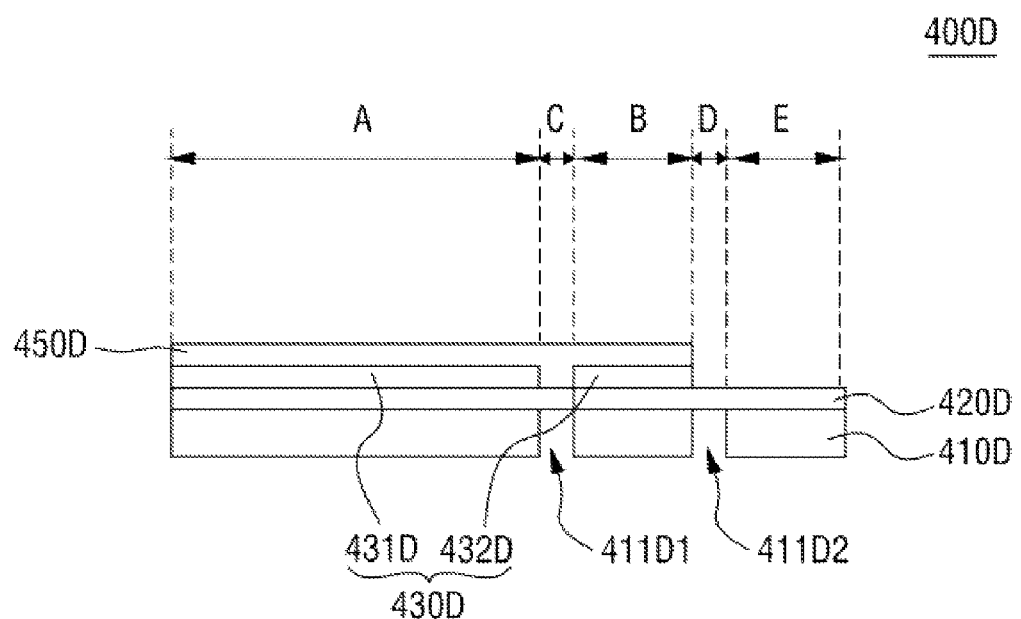
FIG. 4F is a cross-sectional view of a flexible display device according to an embodiment of the present invention.
Figure 4G:
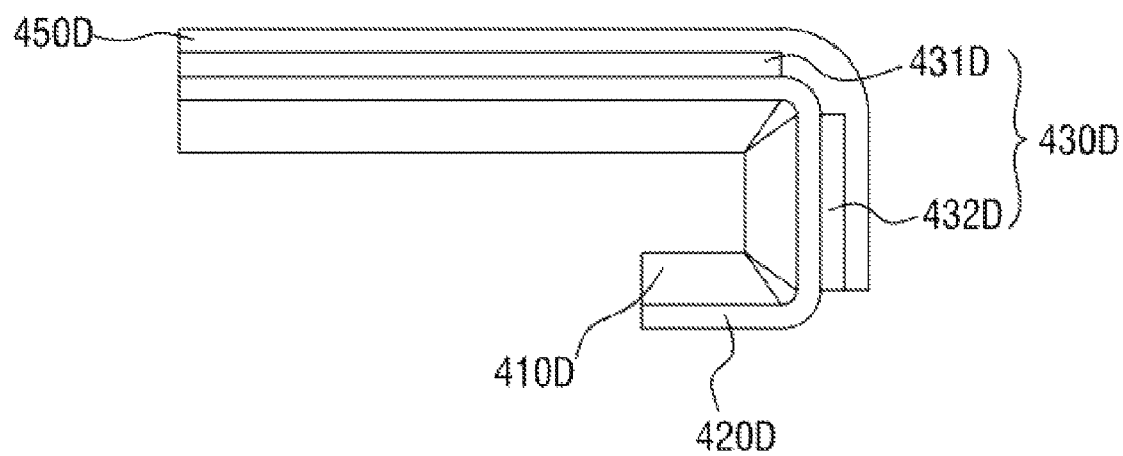
FIG. 4G is a cross-sectional view showing the flexible display device of FIG. 4F in a bent state.

FIG. 4F is a cross-sectional view of a flexible display device according to an embodiment of the present invention. FIG. 4G is a cross-sectional view showing a bent state of the flexible display device shown in FIG. 4F. The elements shown in FIGS. 4D and 4F are substantially identical to each other when the elements have the same numerals except for the letters in the corresponding reference numerals, and thus repeated description of the elements is omitted herein for the sake of brevity.

A display unit 430D may include a first display unit 431D and a second display unit 432D. The first display unit 431D may be formed at a first area A of a flexible substrate 420D, and the second display unit 432D may be formed at a second area B of the flexible substrate 420D. As the display unit 430D is divided into the first display unit 431D and the second display unit 432D. In some embodiments, the first display unit 431D and the second display unit 432D are configured to operate independently from one another. That is, the first display unit 431D and the second display unit 432D may be configured to receive control signal from a different source (e.g., distinct GIP, distinct content source, distinct drive IC, etc). As such, one display unit may be turned off while the other display unit is displaying image. Also, one display unit may play content from a first input device while the other display unit plays content from a second input device.

When a support film 410D and the flexible substrate 420D are bent with respect to a third area C of the flexible substrate 420D, the second display unit 432D may display an image on a lateral or rear surface of a flexible display device 400D. In some embodiments, the display unit 430D may further include a third display unit. Here, the third display unit may be formed at a fifth area E of the flexible substrate 420D to independently display an image.

A polarizer 450D is formed on the first area A, the second area B and the third area C of the flexible substrate 420D. In the case where the display unit 430D is an organic light emitting diode, a contrast ratio is markedly degraded when an external light incident from the outside is reflected on a metal electrode or a wire of the organic light emitting diode. In the flexible display device 400D according to still another embodiment of the present invention, since the display unit 430D is formed on the first area A and the second area B of the flexible substrate 420D, degradation of the contrast ratio caused by reflection of external light may be prevented by disposing the polarizer 450D on the first area A, the second area B, and the third area C between the second area B and the first area A of the flexible substrate 420D. Also, since the polarizer 450D is formed on the first area A, the second area B and the third area C of the flexible substrate 420D, the polarizer 450D may be curved with respect to the third area C of the flexible substrate 420D as the flexible display device 400D is bent.

Figure 5A:
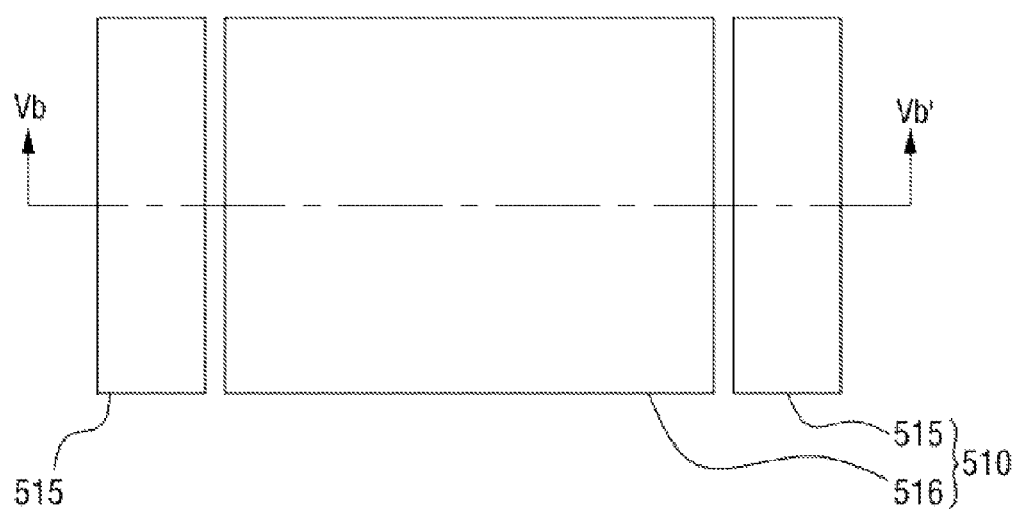
FIG. 5A is a top view of a support film used to illustrate the flexible display device according to an embodiment of the present invention.
Figure 5B:
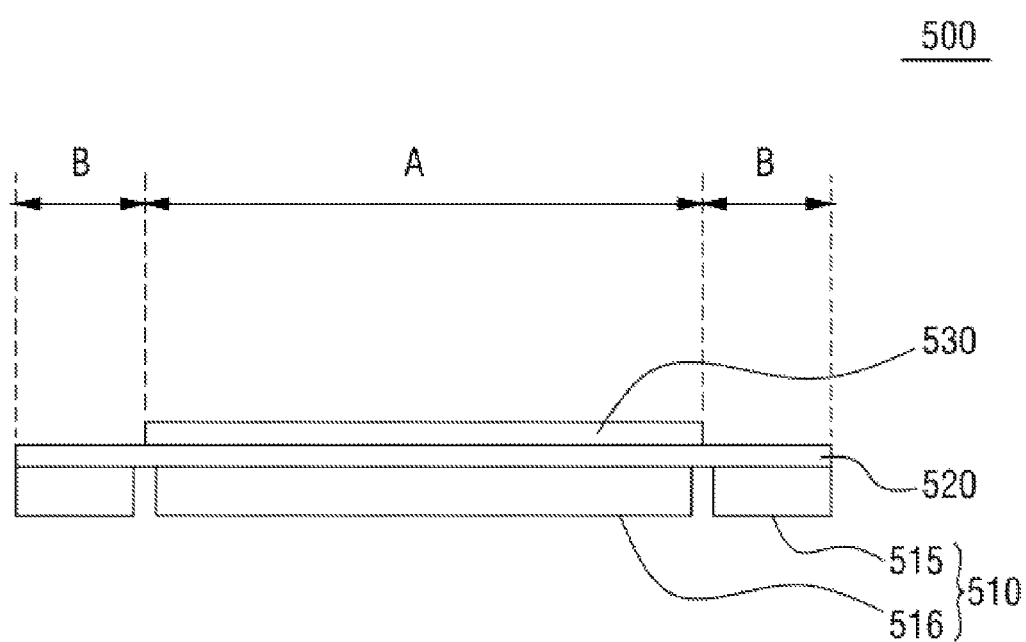
FIG. 5B is a cross-sectional view of the flexible display device taken along the line Vb-Vb' of FIG. 5A.

FIG. 5A is a top view of a support film used to illustrate the flexible display device according to another embodiment. FIG. 5B is a cross-sectional view of the flexible display device taken along line Vb-Vb' of FIG. 5A. Referring to FIGS. 5A and 5B, a flexible display device 500 includes a flexible substrate 520, a display unit 530 and a support film 510. Among the elements of the flexible display device 500, only the support film 510 is shown in FIG. 5A for the sake of convenience of description. The flexible substrate 520 and the display unit 530 are substantially identical to the flexible substrate 220B and the display unit 230B shown in FIGS. 2E and 2F, and thus repeated description of the flexible substrate 520 and the display unit 530 is omitted herein for the sake of brevity.

The support film 510 includes a first support film 515 and a second support film 516. The first support film 515 is disposed on a rear surface of the first area A, and the second support film(s) 516 is disposed the rear surface of the second area(s) B of the flexible substrate 520. The first support film 515 and the second support film(s) 516 are spaced apart from each other with a gap formed between the first support film 515 and the second support film(s) 516. Since there is the gap formed between the first support film 515 and the second support film 516 the elastic restoring force of the support film 510, as a whole, is reduced. Accordingly, bending of the flexible substrate 520 can be localized around the gap and thereby prevent or reduce the peeling of the elements formed on the flexible substrate 520.

In some embodiments, the gap between the first support film 515 and the second support film 516 may be filled with a resin material (e.g., sealant, thermosetting resin) to protect the components on the flexible substrate 520 from the external environments such as moisture or oxygen. The resin material, when filled and cured in the gap, should be less rigidity than the support films adhered on other parts of the display device.

In some embodiments, a side end of first support film 515 and a side end of the second support film 516 are not perpendicular to the corresponding portion of the flexible display substrate, but are angled so that the gap between the two adjacent support films 515 and 516 is reduced upon bending of the flexible substrate 520. This way, the resin material for filling the gap can be wholly eliminated or at least reduced in the flexible display device.

Figure 6:
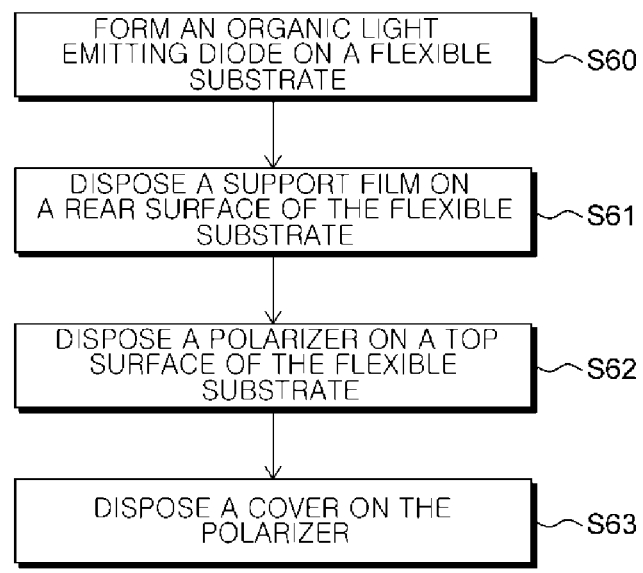
FIG. 6 is a flowchart illustrating an method for manufacturing an embodiment of flexible display.

FIG. 6 is a flowchart illustrating a method of manufacturing a flexible display device according to another embodiment. FIGS. 7A to 7D are cross-sectional views illustrating respective processes of a method of manufacturing an organic light emitting display device according to one embodiment.

First, a display unit is formed on a flexible substrate (S60). Forming the display unit on the flexible substrate will be described in further detail with reference to FIG. 7A.

Figure 7A:
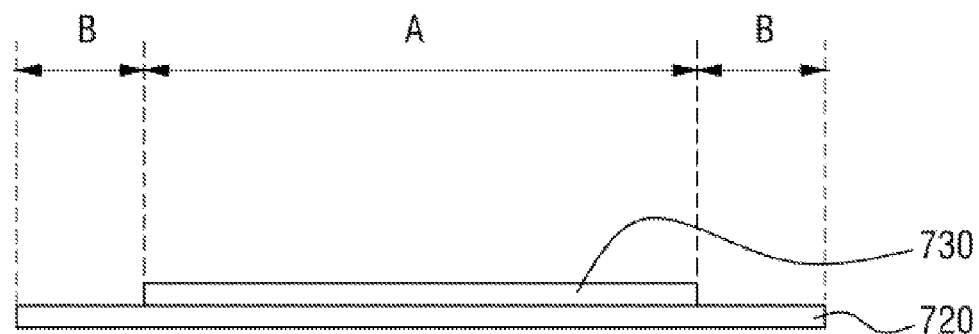
FIGS. 7A to 7D are cross-sectional views illustrating an organic light emitting display device at different steps of manufacturing a flexible display device, according to one embodiment.

Referring to FIG. 7A, forming a display unit 730 on a flexible substrate 720 may include directly forming a display element on the flexible substrate 720, or disposing an externally formed display element on the flexible substrate 720. Forming the display unit 730 on the flexible substrate 720 may include forming the display unit 730 on a display area A of the flexible substrate 720. It is assumed herein that the display unit 730 is an organic light emitting diode for the sake of convenience of description, but the present invention is not limited thereto. For example, various other display elements may be used herein. Forming an organic light emitting diode as the display unit 730 may be performed using various known methods. Next, a support film is disposed on a rear surface of the flexible substrate (S61), and a polarizer is disposed on a top surface of the flexible substrate (S62). Disposing the support film on the rear surface of the flexible substrate and disposing the polarizer on the top surface of the flexible substrate will be described in further detail with reference to FIG. 7B.

Figure 7B:
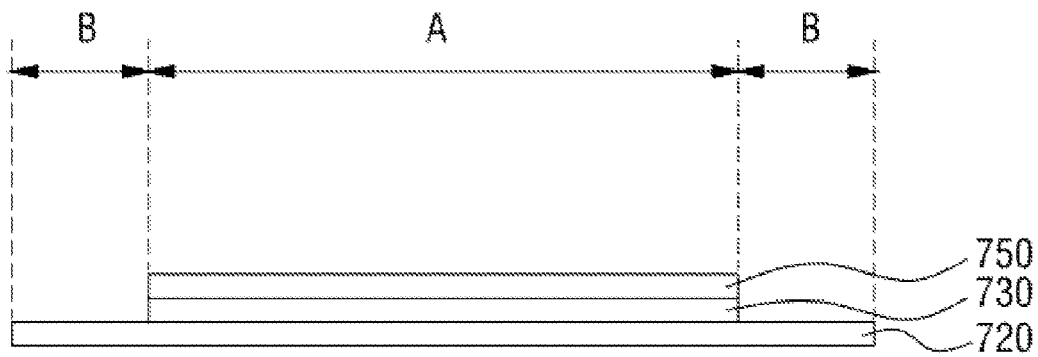

Referring to FIG. 7B, disposing a polarizer 750 on a top surface of the flexible substrate 720 may include disposing the polarizer 750 on the display unit 730 disposed on the display area A of the flexible substrate 720.

Figure 7C:
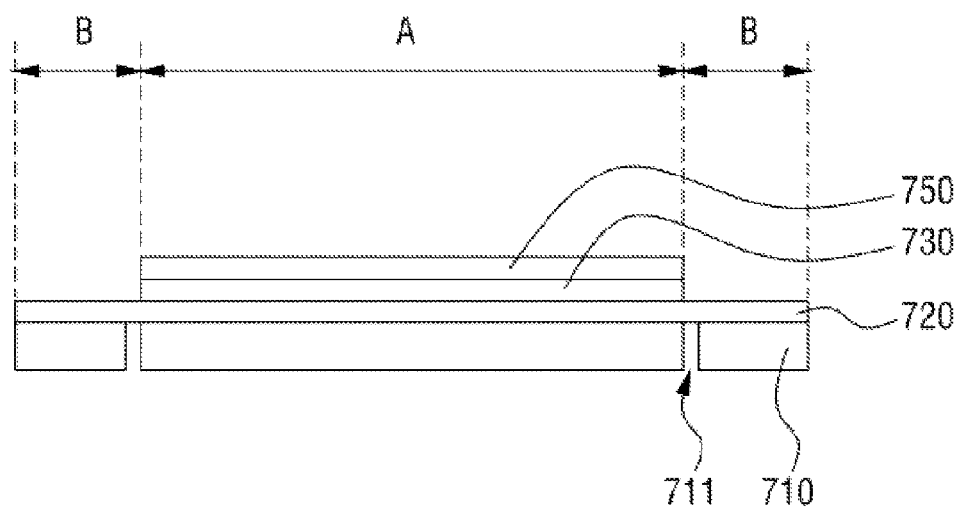
Figure 7D:
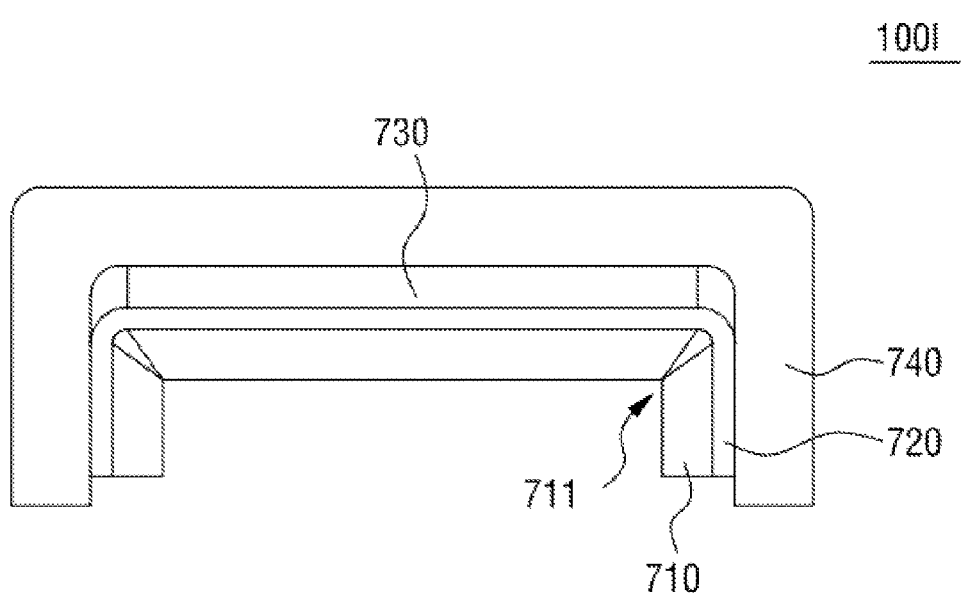

Referring to FIG. 7C, the support film 710 may be disposed to come in contact with the flexible substrate 720. The support film 710 is an element configured to support the flexible substrate 720, and thus may be disposed at a rear surface of the flexible substrate 720.

FIGS. 6 and 7A to 7C show that the polarizer 750 is disposed on the flexible substrate 720, and the support film 710 is then disposed on the flexible substrate 720, but the present invention is not limited thereto. For example, the support film 710 may be disposed on the flexible substrate 720, and the polarizer 750 may then be disposed on the flexible substrate 720.

Subsequently, a cover is disposed on the polarizer (S63). Disposing the cover is substantially identical to the process of disposing the cover shown in FIG. 1I, and thus repeated description of such a process is omitted for brevity.

A pattern for facilitating bending is formed in at least one of the support film 710, the polarizer 750 and a cover 740. For the sake of convenience of description, FIGS. 7A to 7C show that the pattern 711 is formed only in the support film 710 among the support film 710, the polarizer 750 and the cover 740, but the present invention is not limited thereto. For example, the pattern may be formed in at least one of the support film 710, the polarizer 750 and the cover 740. Forming the pattern for facilitating the bending in at least one of the support film 710, the polarizer 750 and the cover 740 may include forming the pattern in at least one of the support film 710, the polarizer 750 and the cover 740 using a laser process as well as a mechanical process such as a piercing process, a punching process, a press process, a half-cutting process, etc. The pattern for facilitating the bending is substantially identical to the pattern for facilitating the bending shown in FIGS. 1 through 5, and thus repeated description of the pattern for facilitating the bending is omitted for brevity.

According to the embodiments of the present invention, the flexible display device and the method of manufacturing the same have at least the following effects. The flexible display device capable of realizing a narrow bezel-type or bezel-free display device and also enables improved types of design and improved method of manufacturing the flexible display device. Also, narrow bezel-type or bezel-free display device can be embodied by facilitating bending of a bezel area of the flexible display device. Further, damage to the bending area can be reduced.

It will be apparent to those skilled in the art that various modifications can be made to the above-described embodiments of the present invention without departing from the scope of the invention. Thus, it is intended that the present invention covers all such modifications provided they come within the scope of the appended claims and their equivalents.

What is claimed is:
1. A flexible display device, comprising:
a support substrate; and
a flexible display substrate provided on the support substrate, the flexible display substrate having a display area and a peripheral circuit area adjacent to the display area, the display area provided with pixel elements for generating an image, and the peripheral circuit area provided with components for operating the pixel elements, wherein the flexible display substrate is longer than the support substrate such that a portion of the flexible display substrate is curved around at least one end of the support substrate,
wherein at least some part of the peripheral circuit area is provided in the curved portion of the flexible display substrate,
a wire is provided in the curved portion of the flexible display substrate, and
an organic film is provided on the wire in the curved portion of the flexible display substrate so as to minimize a force applied to the wire.

2. The flexible display device of claim 1, wherein the at least one end of the support substrate which the flexible substrate is curved around has a curved side surface.

3. The flexible display device of claim 1, wherein a protection layer is provided on the pixel elements of the display area of the flexible display substrate.

4. The flexible display device of claim 1, further comprising a cover glass covering the display area of the flexible display substrate.

5. The flexible display device of claim of claim 1, further comprising a polarizer covering the display area of the flexible display substrate.

6. A display device comprising:

a bendable film structure having a front surface with organic light emitting layers at display areas and components related to driving said organic light emitting layers at non-display areas;

a back film structure at a rear surface of said bendable film structure and configured to provide rigidity to said bendable film structure and to block moisture or oxygen from affecting said organic light emitting layers, said bendable film structure having two opposing edges that extend on two corresponding opposing edges of said back film structure, respectively; and a see-through cover against the front surface of said bendable film structure and configured to allow said bendable film structure and said back film structure to retain a configuration with bent or curved edges, wherein a metal thin film layer is disposed between a rear surface of said bendable film structure and said back film structure.

7. The device of claim 6, wherein said cover is attached to said bendable film structure by an adhesive member.

8. The device of claim 6, wherein said bendable film structure and said back film structure are configured to have transparent characteristics in order to achieve a transparent display configuration.

9. The device of claim 6, wherein said components related to driving said organic light emitting layers at non-display areas include at least one among gate driver integrated circuits, source driver integrated circuits, operational circuits, controllers, and conductive wires.

10. The device of claim 6, wherein at least some part of the non-display areas is provided in a curved portion of the bendable film structure.

* * * * *